United States Patent
Soma et al.

(10) Patent No.: US 10,115,251 B2
(45) Date of Patent: Oct. 30, 2018

(54) SEMICONDUCTOR DEVICE

(71) Applicant: Renesas Electronics Corporation, Tokyo (JP)

(72) Inventors: Osamu Soma, Tokyo (JP); Akira Uemura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 271 days.

(21) Appl. No.: 15/141,676

(22) Filed: Apr. 28, 2016

(65) Prior Publication Data

US 2016/0365721 A1 Dec. 15, 2016

(30) Foreign Application Priority Data

Jun. 11, 2015 (JP) .................... 2015-117957

(51) Int. Cl.
| | |
|---|---|
| *H02H 9/00* | (2006.01) |
| *G07C 9/00* | (2006.01) |
| *H03K 19/0175* | (2006.01) |
| *H05B 33/08* | (2006.01) |
| *F02N 11/08* | (2006.01) |
| *B60Q 11/00* | (2006.01) |

(52) U.S. Cl.
CPC . *G07C 9/00182* (2013.01); *H03K 19/017509* (2013.01); *H05B 33/089* (2013.01); *H05B 33/0815* (2013.01); *B60Q 11/005* (2013.01); *F02N 11/0807* (2013.01); *H01L 2224/48247* (2013.01); *H01L 2224/49171* (2013.01); *H01L 2924/181* (2013.01); *Y02B 20/341* (2013.01)

(58) Field of Classification Search
CPC .................................................. G07C 9/00182
See application file for complete search history.

(56) References Cited

U.S. PATENT DOCUMENTS

| | | |
|---|---|---|
| 6,262,902 B1 | 7/2001 | Watanabe |
| 6,756,689 B2 | 6/2004 | Nam et al. |
| (Continued) | | |

FOREIGN PATENT DOCUMENTS

| | | |
|---|---|---|
| JP | H04-352209 A | 12/1992 |
| JP | 2000-174202 A | 6/2000 |
| (Continued) | | |

OTHER PUBLICATIONS

Japanese Office Action dated Jul. 17, 2018, with an English translation.

*Primary Examiner* — Stephen W Jackson

(74) *Attorney, Agent, or Firm* — McGinn IP Law Group, PLLC

(57) ABSTRACT

A sophisticated semiconductor device is provided. A semiconductor device including an IPD chip and an MCU chip which are included in one package. The IPD chip includes: a power transistor that drives an external load; a gate drive circuit that drives the power transistor; and a protection circuit that protects the power transistor from having a breakdown. The MCU chip includes an arithmetic processing unit that performs arithmetic processing based on detected data output from the protection circuit, and a storage unit that stores a program for the arithmetic processing unit. The MCU chip has a function of controlling operation of the power transistor according to the detected data.

20 Claims, 29 Drawing Sheets

(56) References Cited

U.S. PATENT DOCUMENTS

| | | | |
|---|---|---|---|
| 7,402,895 B2* | 7/2008 | Krishnan | H01L 23/3107 257/676 |
| 8,698,549 B2 | 4/2014 | Souma | |
| 8,779,575 B2 | 7/2014 | Shinohara | |
| 9,062,647 B2 | 6/2015 | Yamada | |
| 9,187,026 B2 | 11/2015 | Kurebayashi | |
| 9,785,161 B2* | 10/2017 | Vaisband | G05F 1/46 |

FOREIGN PATENT DOCUMENTS

| | | |
|---|---|---|
| JP | 2011-110986 A | 4/2001 |
| JP | 2007-329718 A | 12/2007 |
| JP | 2011-134990 A | 7/2011 |
| JP | 2013-172129 A | 9/2013 |
| JP | 2013-238218 A | 11/2013 |
| JP | 2014-080143 A | 5/2014 |

\* cited by examiner

OVERHEAT LATCH-OFF SPECIFICATION

US 10,115,251 B2

SEMICONDUCTOR DEVICE

CROSS-REFERENCE TO RELATED APPLICATIONS

This application is based upon and claims the benefit of priority from Japanese patent application No. 2015-117957, filed on Jun. 11, 2015, the disclosure of which is incorporated herein in its entirety by reference.

BACKGROUND

The present invention relates to a semiconductor device. For example, the present invention can be suitably used for a semiconductor device including a power device and a microcontroller that controls the power device.

An intelligent power device (IPD) is known as a semiconductor device that controls electric power supplied from a battery power supply to a load (e.g., see Japanese Unexamined Patent Application Publication No. 2013-172129). The IPD is used to drive, for example, an indicator, a lamp, and an actuator of a vehicle. The IPD has a configuration in which a power transistor that switches ON/OFF of a power supply, a gate drive circuit that drives the gate of the power transistor, a protection circuit, and the like are incorporated in a semiconductor chip.

SUMMARY

On the other hand, in semiconductor devices, such as an onboard ECU (Electronic Control Unit), an SiP (System in Package) having a configuration in which a plurality of semiconductor chips are included in one package has been adopted. For example, a semiconductor chip including an IPD (Intelligent Power Device) and a semiconductor chip including an MCU (Micro Controller Unit; microcontroller) that controls the IPD are included in one package. This configuration makes it possible to provide a sophisticated semiconductor device.

Therefore, in one embodiment, an object of the present invention is to provide a sophisticated semiconductor device.

Other objects and novel features of the present invention will become apparent from the following description and the accompanying drawings.

A first aspect of the present invention is a semiconductor device including two semiconductor chips that are included in one package. One of the semiconductor chips includes: a power transistor that drives an external load; a drive circuit that drives the power transistor; and a protection circuit that protects the power transistor from having a breakdown. The other one of the semiconductor chips includes: an arithmetic processing unit that performs arithmetic processing; and a storage unit that stores a program for the arithmetic processing unit.

The arithmetic processing unit of the other one of the semiconductor chips may perform arithmetic processing based on detected data output from the protection circuit, and may control operation of the power transistor according to the detected data. The one of the semiconductor chips may include a level shift circuit that steps down a voltage of an externally input signal to be output to the other one of the semiconductor chips, and may also include a drive circuit that drives another external load.

According to the first aspect, it is possible to provide a sophisticated semiconductor device.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
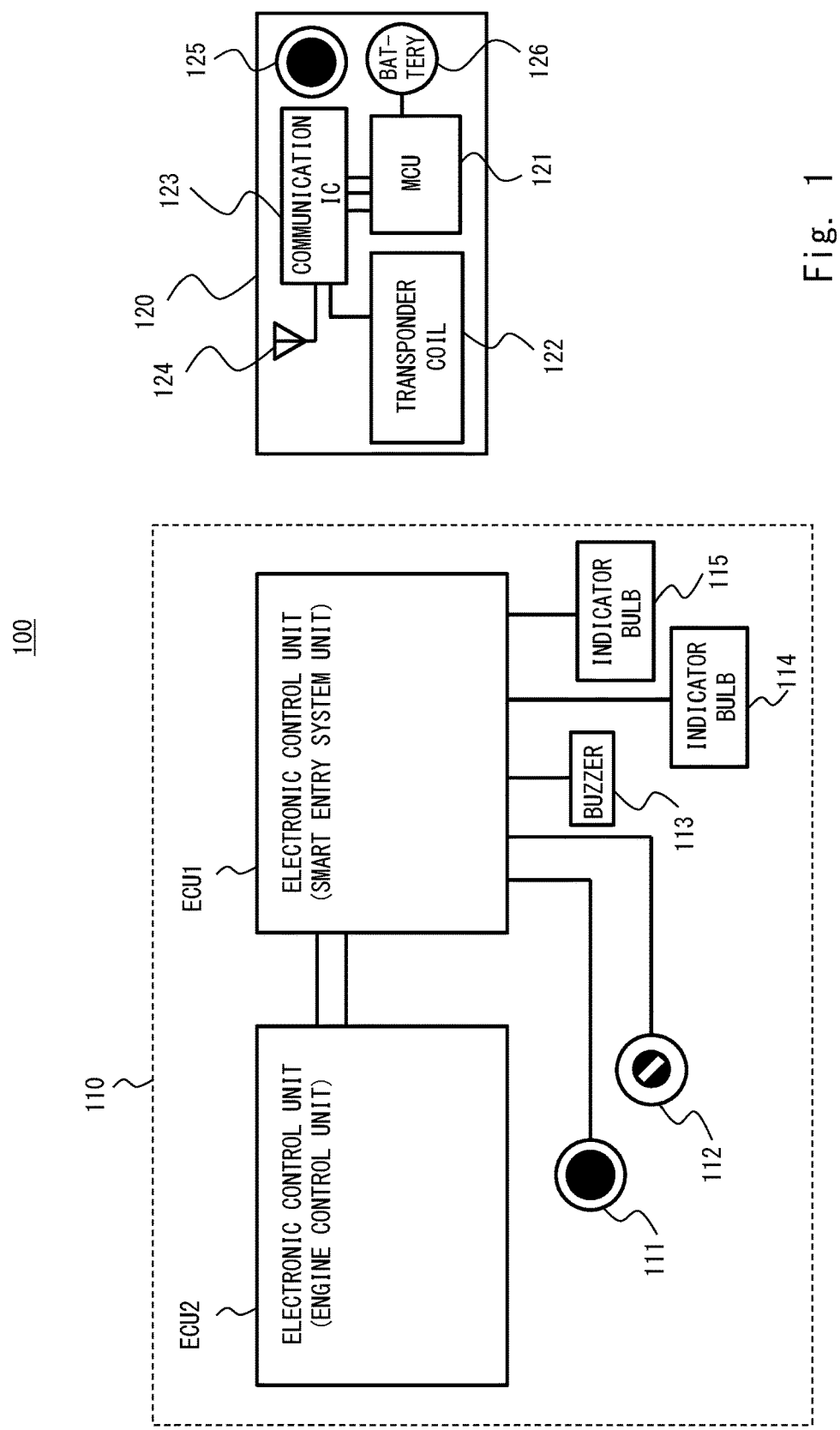
FIG. 1 is a block diagram showing a configuration example of a smart entry system according to a first embodiment.

The following description and the drawings are abbreviated or simplified as appropriate for clarity of explanation. The elements illustrated in the drawings as functional blocks for performing various processes can be implemented hardwarewise by a CPU, a memory, and other circuits, and softwarewise by a program loaded into a memory. Accordingly, it is understood by those skilled in the art that these functional blocks can be implemented in various forms including, but not limited to, hardware alone, software alone, and a combination of hardware and software. Note that in the drawings, the same elements are denoted by the same reference numerals, and repeated descriptions thereof are omitted as needed.

(First Embodiment)

A first embodiment will be described below with reference to the drawings.

<Configuration of Smart Entry System>

FIG. 1 shows a configuration example of a smart entry system according to the first embodiment. The smart entry system is a system that enables a keyless manipulation, such as starting of an engine, as long as a driver of a vehicle has a key for the vehicle with him/her, without the need for inserting the key into a key switch (keyhole). The smart entry system is described as an example of application of a semiconductor device to be described later. However, other systems may also be employed as long as the systems include a semiconductor device.

As shown in FIG. 1, a smart entry system 100 according to the first embodiment includes an onboard unit 110 that is mounted on a vehicle, and a key unit 120 that is owned by a driver (user).

The onboard unit 110 includes electronic control units ECU1 and ECU2 which are onboard semiconductor devices. The electronic control unit ECU1 is a smart entry system unit that controls a keyless manipulation. The electronic control unit ECU1 is connected to a starter switch 111, a key switch 112, and the like which are examples of an input unit that accepts a driver's manipulation. The electronic control unit ECU1 is also connected to a buzzer 113, indicator bulbs 114 and 115, and the electronic control unit ECU2, which are examples of a control target.

The electronic control unit ECU2 is an engine control unit that controls the operation of the engine. The electronic control unit ECU2 is connected to the electronic control unit ECU1, and controls, for example, starting of the engine, according to a signal from the electronic control unit ECU1.

The key unit 120 includes: an MCU (Micro Controller Unit) 121 which is a control unit; a transponder coil 122 which performs radio communication with the onboard unit 110; a communication IC 123; an antenna 124; a switch 125 which is manipulated by the driver; and a battery 126 which is a power supply.

The smart entry system 100 has, for example, an immobilizer function and an answerback function. The immobilizer function is a function fro comparing a key code stored in the key unit 120 with a key code stored in the electronic control unit ECU1, and controlling starting of the engine by the electronic control unit ECU2. The answerback function is a function for causing the indicator bulbs 114 and 115 to blink on and off, or causing the buzzer 113 to emit a sound, in accordance with the manipulation of the switch 125 mounted on the key unit 120.

<Configuration of Electronic Control Unit>

Figure 2:
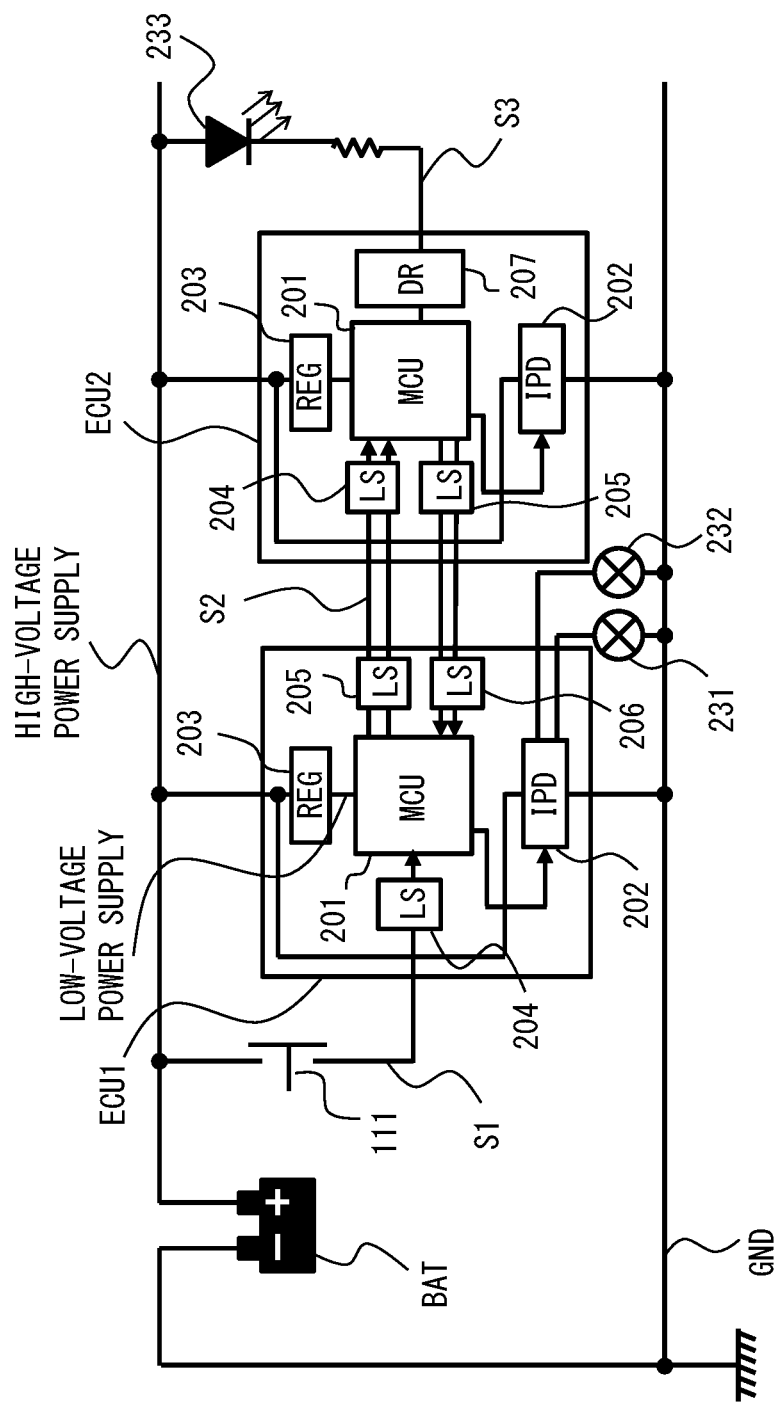
FIG. 2 is a block diagram showing main components of an electronic control unit according to the first embodiment.

FIG. 2 shows main components of the electronic control units ECU1 and ECU2 shown in FIG. 1. As shown in FIG. 2, the electronic control unit ECU1 includes an MCU 201, an IPD 202, a regulator (REG) 203, and level shift circuits (LSs) 204 to 206.

The MCU 201 executes arithmetic processing according to an input signal, and controls the IPD 202 and the electronic control unit ECU2 (or a driver circuit). The IPD 202 drives external loads 231 and 232 in accordance with the control from the MCU 201. Examples of the external loads 231 and 232 include the indicator bulbs 114 and 115 shown in FIG. 1. The regulator 203 generates low voltage power from high voltage power of a battery BAT, and supplies the generated low voltage power to the MCU 201.

The level shift circuits (level shifters) 204 to 206 are circuits that shift (convert) the voltage level of the input signal to another level. The level shift circuit 204 converts a high-voltage signal (a signal of a high-voltage system) S1 from the starter switch 111 into a low-voltage signal (a signal of a low-voltage system), and the level shift circuit 206 converts a high-voltage signal S2 from the electronic control unit ECU2 into a low-voltage signal (a signal of a low-voltage system). The level shift circuits 204 and 206 supply the low-voltage signal to the MCU 201. The level shift circuit 205 converts the low-voltage signal from the MCU 201 into the high-voltage signal S2, and outputs the high-voltage signal S2 to the electronic control unit ECU2.

Similarly to the electronic control unit ECU1, the electronic control unit ECU2 includes the MCU 201, the IPD 202, the regulator 203, the level shift circuits 204 and 205, and a driver circuit (DR) 207. The driver circuit 207 drives an external load 233 according to a high-voltage signal S3 in accordance with the control from the MCU 201. Examples of the external load 233 include the buzzer 113 shown in FIG. 1, and an LED for an indicator.

The power consumption of the external load 233 driven by the driver circuit 207 is smaller than the power consumption of the external loads 231 and 232 driven by the IPD 202. The driver circuit is a circuit that is driven by the MCU, drives a load with low power consumption, and drives an LED, a buzzer, and the like. The IPD is a circuit in which a power transistor drives a load with high power consumption.

The IPD drives a lamp, a heater, a motor, and the like (for example, the IPD drives a lamp in the case of a smart entry system).

Although in the configuration shown in FIG. 2, the electronic control unit ECU1 and the electronic control unit ECU2 have different configurations, the electronic control unit ECU1 and the electronic control unit ECU2 may have the same configuration as needed. Specifically, the electronic control unit ECU1 may include a driver circuit to drive an external load, such as an LED. The IPD 202 of the electronic control unit ECU2 may drive an external load, such as a head lamp.

As shown in FIG. 2, in the ECUs for a vehicle or a motorbike, a high-voltage signal of, for example, a 12 V system (high-voltage system) from the battery BAT, and a low-voltage signal of, for example, a 3.3 V system or a 5 V system (low-voltage system) for operating a device such as an MCU, coexist. The interface between the electronic control units ECU1 and ECU2 takes into consideration the effects of signal-output-side structural constraints (e.g., a switch) and noise. Accordingly, high-voltage signals are used as the signals S1 to S3 shown in FIG. 2. Further, a load (e.g., an LED) which is driven by the electronic control unit ECU2 (or ECU1) is disposed between the 12 V system power supply and the ECU.

In the electronic control units ECU1 and ECU2, a number of devices, such as the MCU 201, which operate at a low voltage that is equal to or lower than 5 V, are arranged. A level shift circuit that converts the level of a low-voltage signal or a high-voltage signal is required to input and output signals between the electronic control units ECU1 and ECU2. Further, when a load, such as a buzzer or an LED, is driven, it is necessary to mount a driver circuit, such as a transistor, to drive the load, in consideration of breakdown voltage and drive capability.

Figure 3:
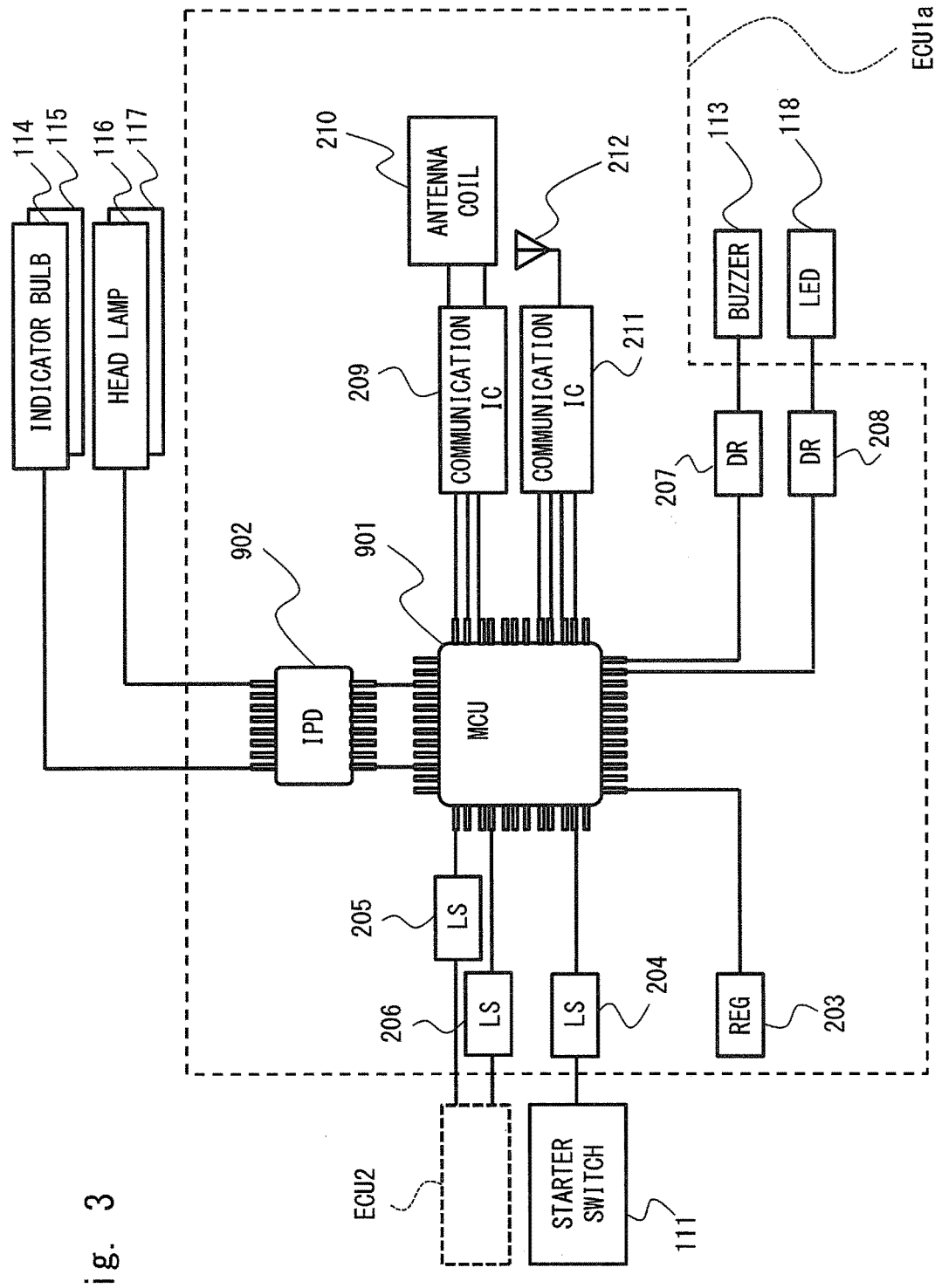
FIG. 3 is a block diagram showing a configuration example of an electronic control unit according to a comparative example.
Figure 4:
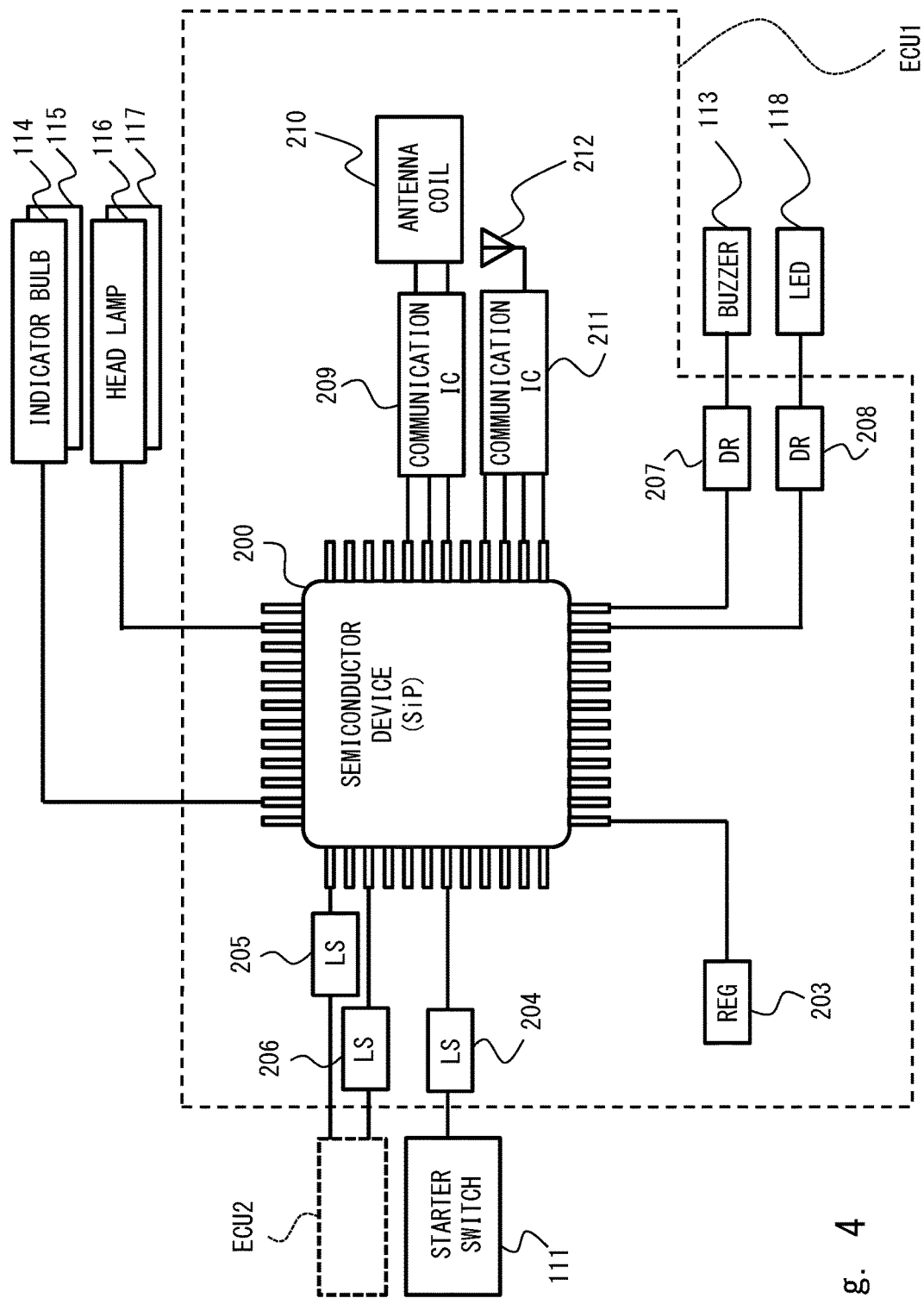
FIG. 4 is a block diagram showing a configuration example of the electronic control unit according to the first embodiment.

FIGS. 3 and 4 show specific configuration examples to implement the electronic control unit ECU1 shown in FIG. 2. FIG. 3 shows an electronic control unit ECU1a according to a comparative example before the embodiment is applied. FIG. 4 shows the electronic control unit ECU1 according to the first embodiment.

As shown in FIG. 3, the electronic control unit ECU1a according to the comparative example includes a semiconductor device 901 having only the MCU function, and a semiconductor device 902 having only the IPD function. The semiconductor device 901 corresponds to the MCU 201 shown in FIG. 2, and the semiconductor device 902 corresponds to the IPD 202 shown in FIG. 2.

On the other hand, the electronic control unit ECU1 according to the first embodiment includes a semiconductor device 200 having both the MCU function and the IPD function as shown in FIG. 4. The semiconductor device 200 corresponds to the MCU 201 and the IPD 202 shown in FIG. 2. Accordingly, a plurality of functions can be implemented by one semiconductor device, and thus a sophisticated semiconductor device can be achieved. Moreover, the number of components can be reduced.

The electronic control unit ECU1 according to the first embodiment includes the semiconductor device 200, the level shift circuits 204 to 206, driver circuits 207 and 208, a communication IC 209, an antenna coil 210, a communication IC 211, and an antenna 212. The communication IC 209, the antenna coil 210, the communication IC 211, and the antenna 212 serve as a communication unit that performs radio communication with the key unit 120.

The semiconductor device 200 is supplied with power from the regulator 203, is connected to the starter switch 111 through the level shift circuit 204, is connected to the electronic control unit ECU2 through the level shift circuits 205 and 206, is connected to the buzzer 113 through the driver circuit 207, is connected to an LED 118 through the driver circuit 208, is connected to the indicator bulbs 114 and 115 and head lamps 116 and 117, and is connected to the communication ICs 209 and 211. To implement the immobilizer function and the answerback function of the smart entry system, the semiconductor device 200 controls the operation (driving) of the electronic control unit ECU2, the indicator bulbs 114 and 115, the head lamps 116 and 117, the buzzer 113, and the LED 118 according to signals received from the starter switch 111 and the communication ICs 209 and 211. The LED is, for example, a pilot lamp or an indicator lamp, and has a function of displaying, on a meter, that the functions are normally operated.

In the immobilizer function, when the key is inserted into the key switch 112 (key cylinder) and is turned, a key switch signal is sent from the key switch 112 to the electronic control unit ECU1. In the electronic control unit ECU1, the semiconductor device 200 (MCU 201) acquires the key code stored in the key unit 120 through the communication IC 209, the antenna coil 210, and the transponder coil 122 and the communication IC 123 of the key unit 120, and determines (compares) whether the key code stored in the key unit 120 matches the key code stored in the semiconductor device 200 (MCU 201). When it is determined that the key codes match, the semiconductor device 200 of the electronic control unit ECU1 outputs, to the electronic control unit ECU2, a signal to permit starting of the engine. In this state, when the starter switch 111 is pressed, or when the key is turned, the electronic control unit ECU2 outputs, to the electronic control unit ECU1, the signal to permit starting of the engine, thereby allowing the engine to start.

In the answerback function, when the switch 125 mounted on the key unit 120 is pressed, an individual identification code (which is different from the above-mentioned key codes) is transmitted through the communication IC 123 and the antenna 124 of the key unit 120. The electronic control unit ECU1 receives the individual identification code through the antenna 212 and the communication IC 211, and transmits the individual identification code to the MCU 201. The MCU 201 outputs a signal to cause the indicator bulbs 114 and 115 to blink on and off or cause the buzzer 113 to emit a sound, according to the received individual identification code, thereby allowing the indicator bulbs 114 and 115 and the buzzer 113 to operate.

The configurations and operations of the systems as shown in FIGS. 1 to 4 are only illustrative, and other control operations may be performed in accordance with the driver's manipulation. For example, a plurality of switches may be mounted on the key unit and a plurality of control operations may be performed according to the switches.

<Configuration of Semiconductor Device>

Figure 5:
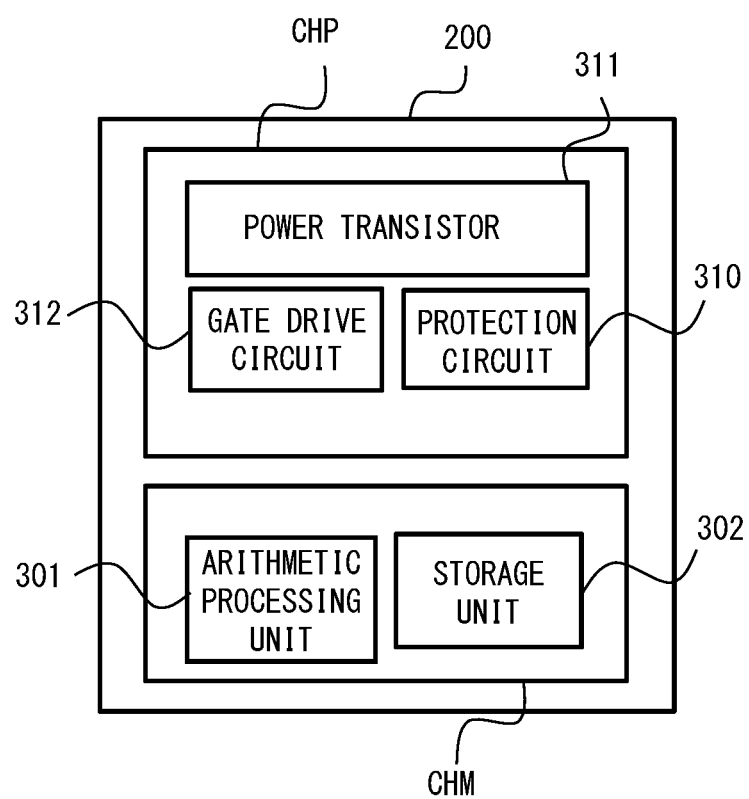
FIG. 5 is a block diagram showing main components of a semiconductor device according to the first embodiment.
Figure 6:
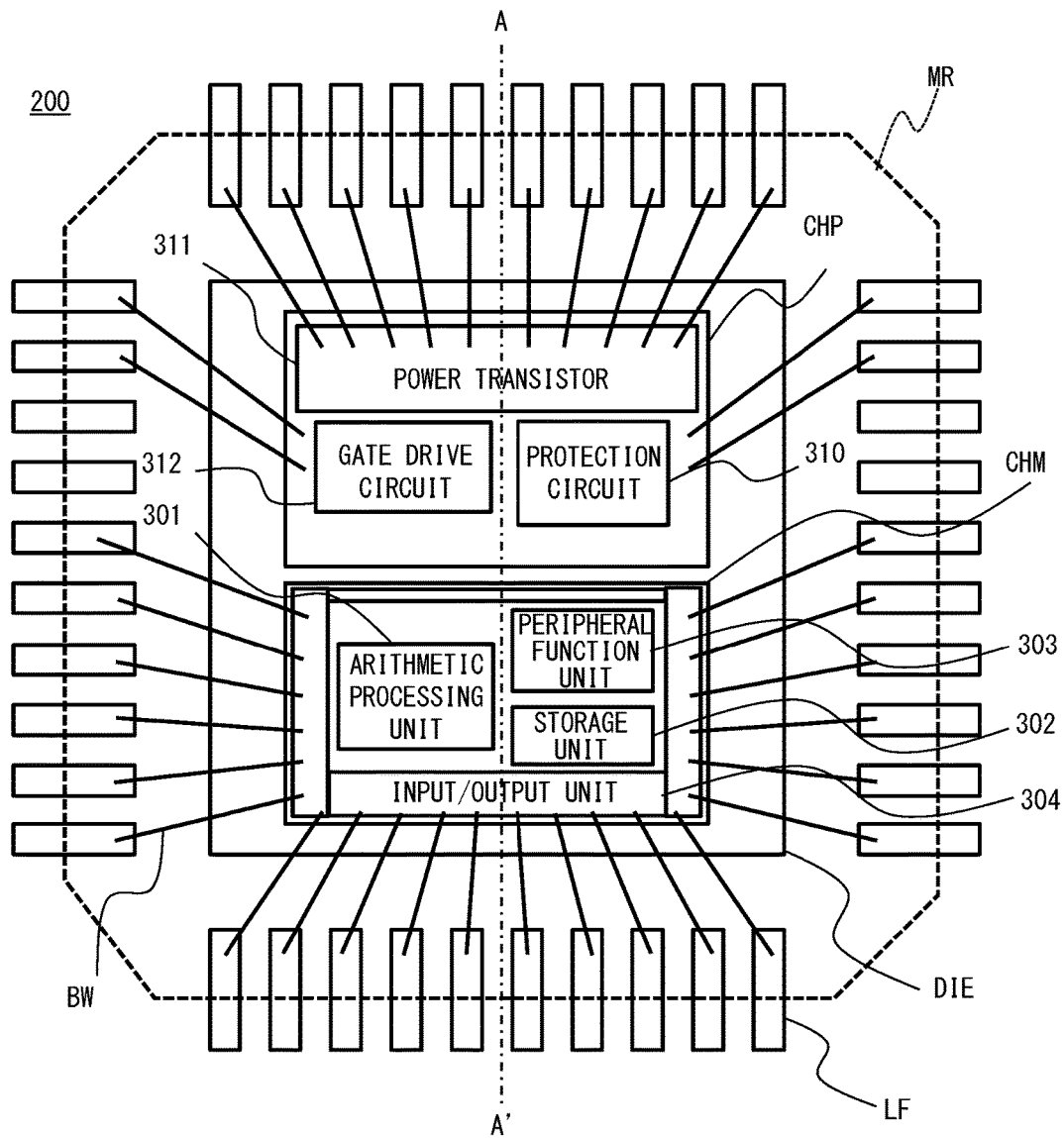
FIG. 6 is a plan view showing a schematic configuration of the semiconductor device according to the first embodiment.
Figure 7:
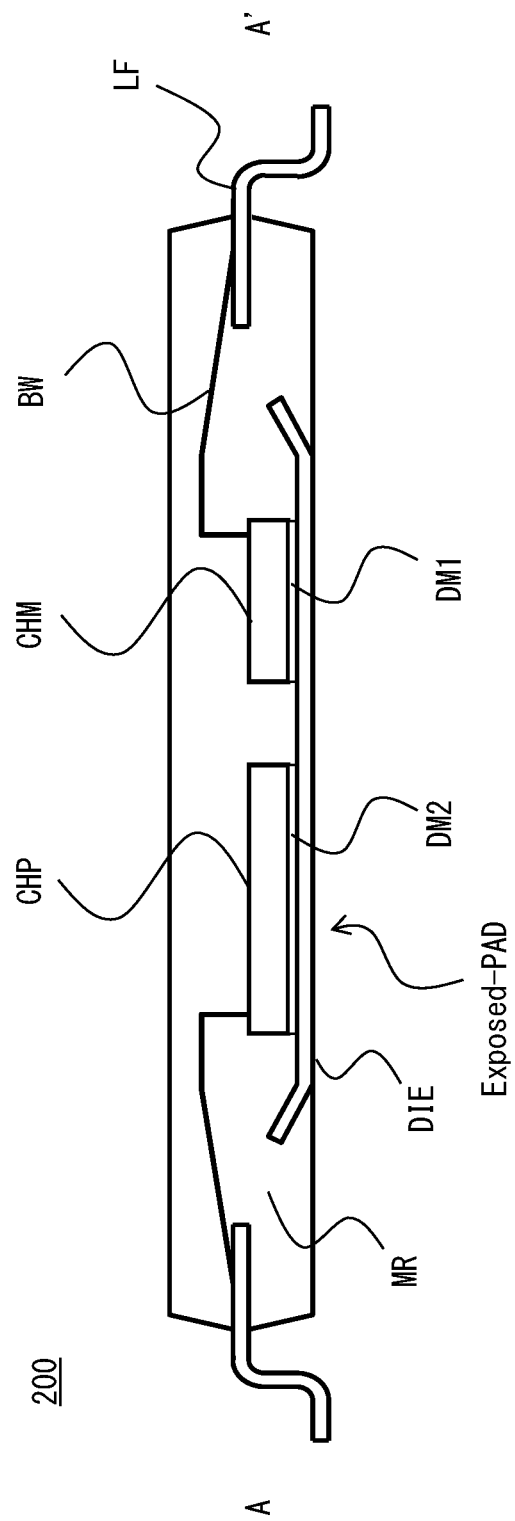
FIG. 7 is a sectional view showing a schematic configuration of the semiconductor device according to the first embodiment.

FIG. 5 shows main components of the semiconductor device 200 according to the first embodiment shown in FIG. 4. FIG. 6 is a plan view showing a schematic overall configuration of the semiconductor device 200. FIG. 7 is a sectional view taken along a line A-A' of FIG. 6. These figures schematically show the arrangement of the components in each semiconductor chip, and illustrate only the parts necessary for the explanation.

As shown in FIG. 5, the semiconductor device 200 according to the first embodiment is a semiconductor device having a configuration in which an IPD chip (semiconductor chip) CHP and an MCU chip (semiconductor chip) CHM are included in one package as main components. The IPD chip CHP includes: a power transistor 311 that drives an external load; a gate drive circuit (drive circuit) 312 that drives the power transistor 311; and a protection circuit 310 that protects the power transistor 311 from having a breakdown. The MCU chip CHM includes an arithmetic processing unit 301 that performs arithmetic processing based on detected data output from the protection circuit 310 of the IPD chip CHP, and a storage unit 302 that stores a program for the arithmetic processing unit 301. Further, the MCU chip CHM has a function of controlling the operation of the power transistor 311 according to the detected data from the protection circuit 310.

Specifically, as shown in FIGS. 6 and 7, the semiconductor device 200 according to the first embodiment is an SiP which includes an Exposed-PAD and has a configuration in which the MCU chip CHM and the IPD chip CHP are included in one package. In other words, the back surface (chip non-mounting surface) of the semiconductor device 200 includes an island DIE serving as the Exposed-PAD, and the MCU chip CHM and the IPD chip CHP are mounted on the island DIE.

The MCU chip CHM is a semiconductor chip on which the circuits of the MCU (MCU 201 shown in FIG. 2) are formed on a semiconductor substrate, and is fixed (die-bonded) onto the island DIE through a die bond material DM1. The IPD chip CHP is a semiconductor chip on which the circuits of the IPD (IPD 202 shown in FIG. 2) are formed on a semiconductor substrate, and is fixed (die-bonded) onto the island DIE through a die bond material DM2.

The MCU chip CHM mainly includes the arithmetic processing unit 301, the storage unit 302, a peripheral function unit 303, and an input/output unit 304. The input/output unit 304 is disposed on the periphery of the semiconductor chip. The IPD chip CHP includes the power transistor (power MOSFET) 311, the gate drive circuit 312, and the protection circuit 310. Detailed configurations of the MCU chip CHM and the IPD chip CHP will be described later.

A plurality of lead frames LF, which are external terminals, are provided in an outer peripheral portion of the semiconductor device 200. The IPD chip CHP and the MCU chip CHM are connected (bonded) to the plurality of lead frames LF with bonding wires BW. The conductive island DIE, the MCU chip CHM, and the IPD chip CHP are sealed with an insulating mold resin MR (package resin) up to a substantially central portion of each lead frame LF so that the back surface of the island DIE is exposed.

In the semiconductor device 200 according to the first embodiment, the IPD chip CHP is a power control device, and thus it is necessary to take into consideration the radiation properties thereof. For this reason, a package including an Exposed-PAD is employed. If the MCU chip CHM and the IPD chip CHP are formed in a stack structure, heat generated in the IPD chip CHP is more likely to be transmitted to the MCU chip CHM. Accordingly, the MCU chip CHM and the IPD chip CHP are preferably die-bonded side by side.

In this example, in terms of the constraints of the mounting chip area with respect to the package size, easiness of processing, and the like, the MCU chip CHM and the IPD chip CHP are die-bonded onto an island. For example, the MCU chip CHM includes a p-type substrate which operates based on the potential of a low-voltage power supply, and the IPD chip CHP includes an N-type substrate which operates based on the potential of a high-voltage power supply. Since the substrates of the respective semiconductor chips have different potentials, it is necessary to electrically isolate the semiconductor chips from each other when the semiconductor chips are die-bonded onto an island.

Because the IPD is used for large current applications, the power transistor 311 incorporated in the IPD chip CHP employs a structure in which a current flows in the longitudinal direction. For this reason, a conductive die bond material, such as an Ag paste or solder, is used as the die bond material DM2 between the island DIE and the IPD chip CHP. As described above, since it is necessary to electrically isolate the substrate of the MCU chip CHM from the substrate of the IPD chip CHP, an insulating die bond material is used as the die bond material DM1 between the island DIE and the MCU chip CHM.

It is also necessary to take into consideration the effect of transmission of heat generated in the IPD chip CHP to the MCU chip CHM. In particular, it is necessary to design the semiconductor device assuming a case where the IPD chip CHP is controlled at a high temperature during protection of the IPD chip CHP against overheating due to a load short-circuit or the like. The conductive die bond material used as the die bond material DM2 is a high-heat conductive material, and the insulating die bond material used as the die bond material DM1 is a low-heat conductive material. Accordingly, heat generated in the IPD chip CHP is more likely to be transmitted to the PCB (printed circuit board) of the ECU via the Exposed-PAD, than heat generated in the MCU chip CHM. Thus, the substrate of one semiconductor chip is electrically isolated from the substrate of the other semiconductor chip on the island. As a result, the heat generated in the IPD chip CHP can be taken into consideration.

<Configuration of MCU Chip>

Figure 8:
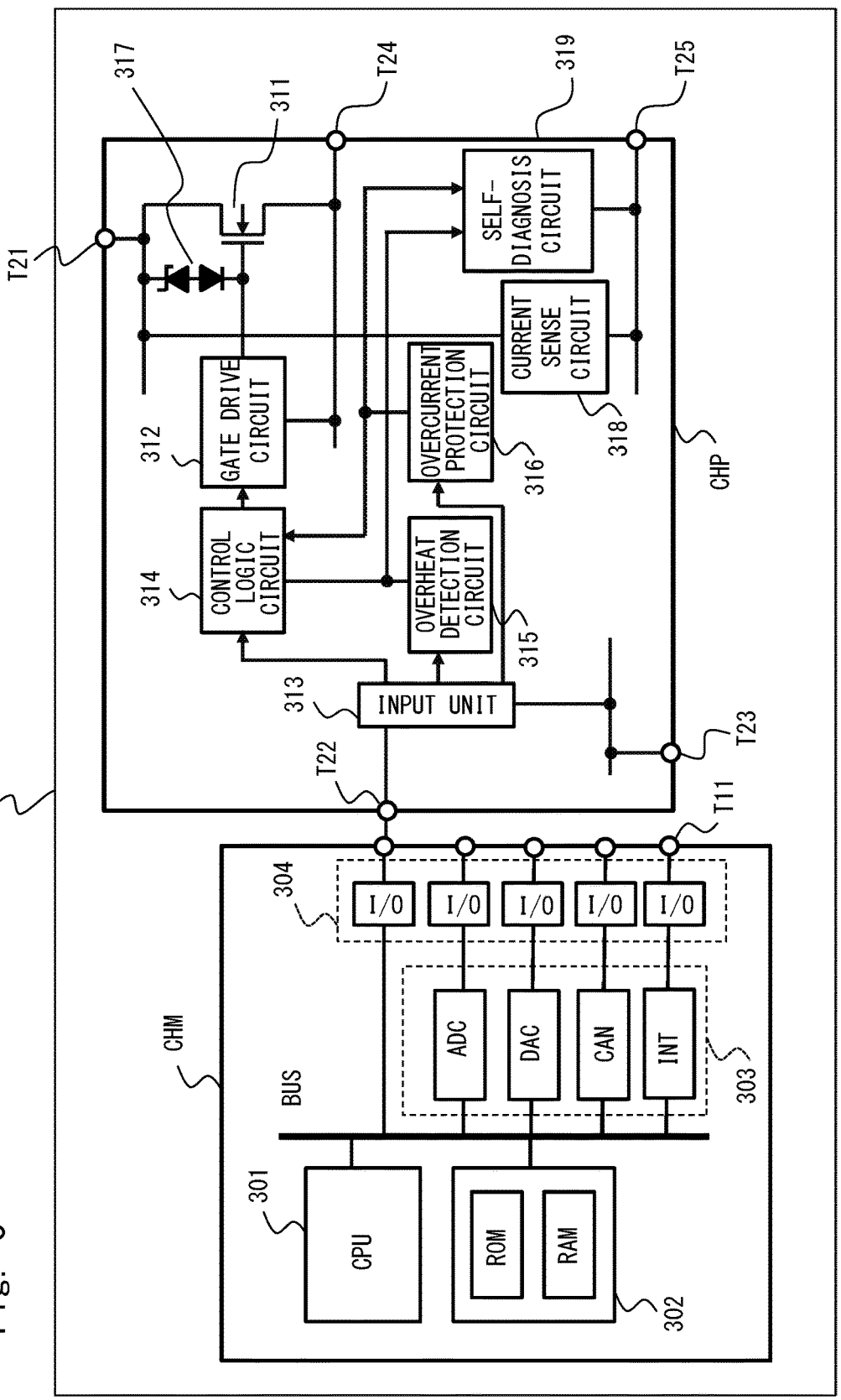
FIG. 8 is a block diagram showing a configuration example of the semiconductor device according to the first embodiment.

FIG. 8 is a functional block diagram showing the MCU chip CHM and the IPD chip CHP according to the first embodiment. FIG. 8 shows the functions and physical circuits of the MCU chip CHM and the IPD chip CHP.

As shown in FIG. 8, the MCU chip CHM includes the arithmetic processing unit (CPU) 301, the storage unit 302, the peripheral function unit 303, and the input/output unit 304. These components are connected to each other via a bus line BUS. The MCU chip CHM includes a plurality of terminals T11 as input/output terminals. The bus line BUS is directly connected with the arithmetic processing unit 301 and the storage unit 302. The bus line BUS is directly connected with the input/output unit 304, or is connected with the input/output unit 304 via the peripheral function unit 303.

The arithmetic processing unit 301 executes the program stored in the storage unit 302, and performs various arithmetic processings based on the input data (detected data of the IPD chip, or digital data obtained through conversion by an ADC). For example, the arithmetic processing unit 301 executes arithmetic operations and logical operations based on the data obtained from the IPD chip CHP, i.e., based on the monitored temperature, current, or the like in the IPD chip.

The storage unit 302 includes a ROM (Read Only Memory, non-volatile memory) region in which a program and the like for the arithmetic processing unit 301 are stored, and a RAM (Random Access Memory, volatile memory) region in which variables and the like for the program are stored. The input/output unit 304 is connected to the terminals T11, and inputs and outputs data, such as a temperature or a current, to and from the IPD chip CHP through the terminals T11. The input and output of the input/output unit 304 may be arbitrarily set by software stored in the storage unit 302.

The peripheral function unit 303 includes an analog-to-digital conversion unit ADC, a digital-to-analog conversion unit DAC, a communication control unit CAN, and an interrupt control unit INT, as examples of peripheral functions. The analog-to-digital conversion unit ADC converts an input analog signal into a digital signal. For example, the analog-to-digital conversion unit ADC converts an analog signal, such as a temperature or a current, which is monitored by the IPD chip CHP, into a digital signal. The digital-to-analog conversion unit DAC converts the received digital signal into an analog signal. The communication control unit CAN performs a control necessary for communication via a CAN (Controller Area Network). The interrupt control unit INT accepts an interrupt and notifies the arithmetic processing unit 301 of the interrupt.

<Configuration of IPD Chip>

As shown in FIG. 8, the IPD chip CHP includes the power transistor 311, the gate drive circuit 312, an input circuit 313, a control logic circuit 314, an overheat detection circuit 315, an overcurrent protection circuit 316, an overvoltage protection circuit 317, a current sense circuit 318, and a self-diagnosis circuit 319. The IPD chip CHP includes input/output terminals T21 to T25.

The power supply terminal T21 is a terminal that is connected to the battery BAT and supplies power from the battery BAT to each circuit within the IPD. The input terminal T22 is a terminal that is connected to the MCU chip CHM and receives a control signal from the MCU chip CHM. The GND terminal T23 is a terminal that is connected to a GND and grounds (supplies a ground potential to) each circuit within the IPD.

The output terminal T24 is a terminal that is connected to a load and supplies power to the load. The dual-purpose terminal T25 is a dual-purpose terminal that is used for self-diagnosis output and current monitor, and is capable of self-diagnosis output and current monitor for the IPD. The dual-purpose terminal T25 is directly connected to the MCU chip CHM, or is connected to the MCU chip CHM via an external line. The MCU chip CHM monitors the output of the dual-purpose terminal T25, and also monitors the state of the IPD.

The input circuit 313 is a threshold circuit that is connected to the input terminal T22 and determines "H/L" of the voltage applied (input) to the input terminal T22 from the MCU chip CHM. The control logic circuit 314 determines ON/OFF of the power transistor 311 based on signals from the input circuit 313 (control from the MCU chip CHM) and each protection circuit (detection of an overheat or overcurrent), and outputs a signal for turning on/off to the gate drive circuit 312. The gate drive circuit 312 controls the gate potential of the power transistor 311 based on the output of the control logic circuit 314, and switches ON/OFF of the power transistor 311.

The power transistor 311 is, for example, a vertical Nch MOS transistor. The power transistor 311 has a drain connected to the power supply terminal T21, a source connected to the output terminal T24, and a gate connected to the gate drive circuit 312. The power transistor 311 turns on/off under drive from the gate drive circuit 312, and supplies power (battery power) of the power supply terminal T21 to the load, which is connected to the output terminal T24, or turns off the power supply.

For example, the protection circuit (protection circuit 310 shown in FIG. 6) may include the overheat detection circuit 315, the overcurrent protection circuit 316, the overvoltage protection circuit 317, the current sense circuit 318, and the self-diagnosis circuit 319, as examples of a circuit that protects the power transistor 311 from having a breakdown. The overheat detection circuit 315 is a circuit that protects the IPD (power transistor 311) from an overheat state. The overheat detection circuit 315 monitors the temperature of the power transistor 311. When the temperature of the power transistor 311 reaches a certain value, the overheat detection circuit 315 outputs a signal indicating an overheat state to the control logic circuit 314, and turns off the power transistor 311. For example, a temperature sensor element, such as a diode, is disposed in the power transistor 311 within the IPD. The overheat detection circuit 315 monitors the temperature of the temperature sensor element, and controls the temperature of the power transistor 311 to a temperature lower than a certain value.

The overcurrent protection circuit 316 is a circuit that protects the IPD (power transistor 311) from an overcurrent state. The overcurrent protection circuit 316 monitors the current flowing through the power transistor 311. When the current reaches a certain value, the overcurrent protection circuit 316 outputs a signal indicating an overcurrent state to the control logic circuit 314, and turns off the power transistor 311.

The overvoltage protection circuit 317 is a circuit that protects the IPD (power transistor 311) from an overvoltage state. For example, the overvoltage protection circuit 317 is an avalanche diode connected to a node between the gate and the source of the power transistor 311. The overvoltage protection circuit 317 monitors the voltage between the gate and the source of the power transistor 311. When an overvoltage is applied, the overvoltage protection circuit 317 controls the gate potential of the power transistor 311 to turn off the power transistor 311, thereby preventing the power transistor 311 from having an avalanche breakdown.

The current sense circuit (current monitor circuit) 318 has a function of monitoring the current flowing through the power transistor 311 (load). The current sense circuit 318 outputs the value of the monitored current to the MCU chip CHM through the terminal T25, and the MCU chip CHM performs processing according to the obtained current value. For example, in a case where a plurality of lamps are driven as loads, when any one of the lamps is disconnected, the current value changes. Accordingly, when an alarm is issued to the driver, or when the motor is driven, the number of revolutions of the motor is monitored and the vehicle can be controlled according to the monitored number of revolutions of the motor.

Whether the power transistor 311 (IPD chip CHP) operates normally or not may be checked based on the monitored current value. For example, first, in a state where the power transistor 311 is turned on and a current I1 is applied to the terminal T24, the MCU chip CHM stores the current value monitored by the current sense circuit 318. Next, in a state where the power transistor 311 is turned on and a current I2 is applied to the terminal T24, the current sense circuit 318 can obtain the monitored current value and check whether the power transistor 311 operates normally or not based on the current value monitored when the current I1 is applied and the current value monitored when the current I2 is applied.

The self-diagnosis circuit 319 outputs an abnormality detection signal when overheat detection or overcurrent protection is effected. The self-diagnosis circuit 319 is connected to the output terminals of the overheat detection circuit 315 and the overcurrent protection circuit 316. When the overheat detection circuit 315 outputs a signal indicating that the overheat state is detected, or when the overcurrent protection circuit 316 outputs a signal indicating that the overcurrent state is detected, the self-diagnosis circuit 319 outputs a signal indicating that an abnormal state is detected to the MCU chip CHM through the terminal T25.

Figure 9:
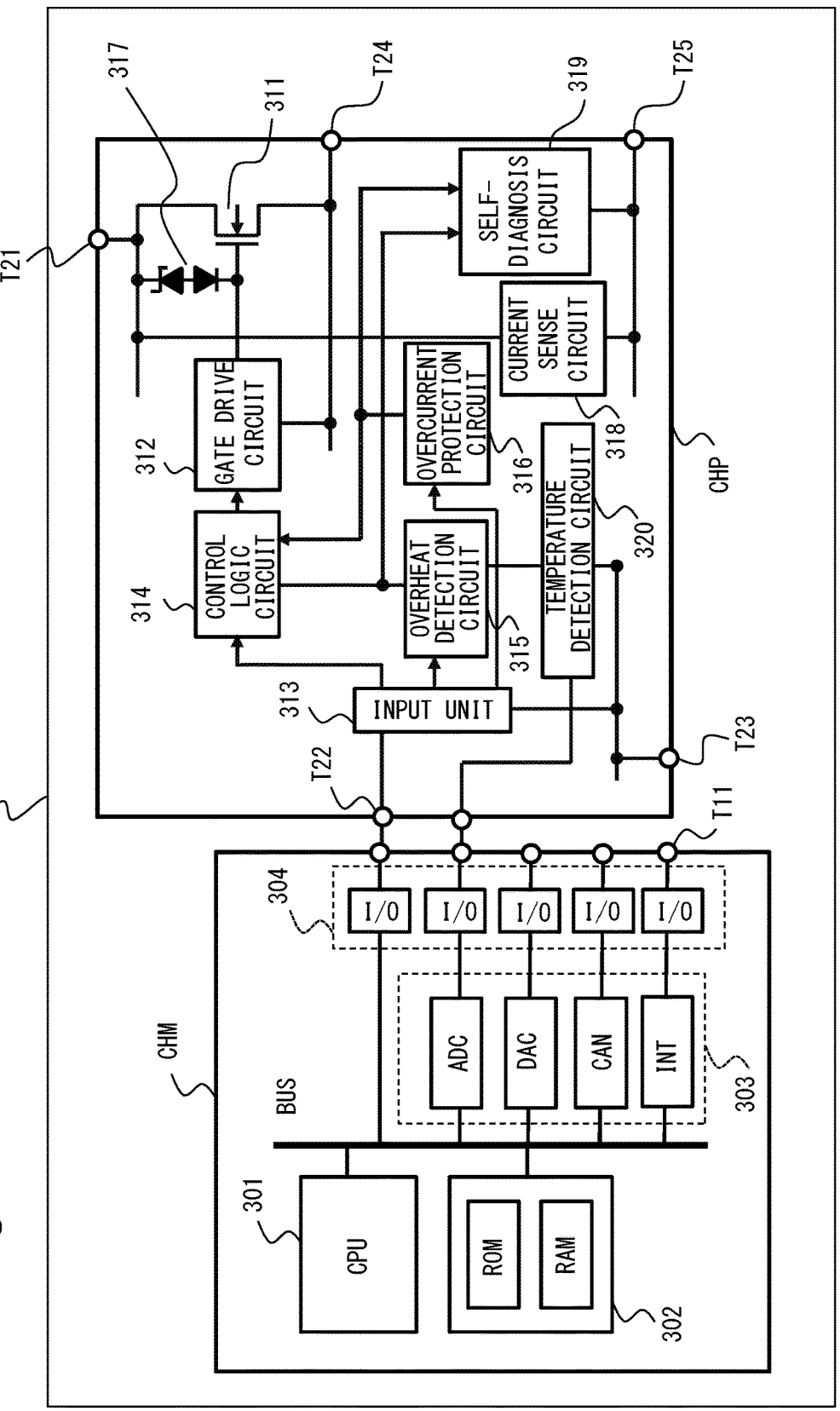
FIG. 9 is a block diagram showing another configuration example of the semiconductor device according to the first embodiment.

FIG. 9 shows another configuration example of the IPD chip CHP according to the first embodiment. As shown in FIG. 9, the IPD chip CHP may include a temperature detection circuit 320 in addition to the components of the IPD chip CHP shown in FIG. 8. The temperature detection circuit 320 is a circuit that outputs the temperature of the power transistor 311 within the IPD. The temperature detection circuit 320 is connected to the temperature sensor in the power transistor 311 that is the same as the overheat detection circuit 315. Alternatively, the temperature detection circuit 320 is connected to a temperature sensor separately disposed. The temperature detection circuit 320 outputs, to the MCU chip CHM, an analog signal representing the temperature detected by the temperature sensor. In the MCU chip CHM, the analog-to-digital conversion unit ADC converts the analog signal into a digital signal, and monitors the converted temperature. The MCU chip CHM turns on/off the power transistor according to the monitored temperature. With this configuration, any temperature control can be made using the program of the MCU, unlike in the overheat detection circuit. Monitoring the temperature of the IPD in the MCU chip CHM makes it possible to control the IPD to operate at a certain temperature or lower according to user's circumstances. For example, when a certain temperature is reached, the IPD is driven with PWM.

<Configuration of Power Transistor>

Figure 10:
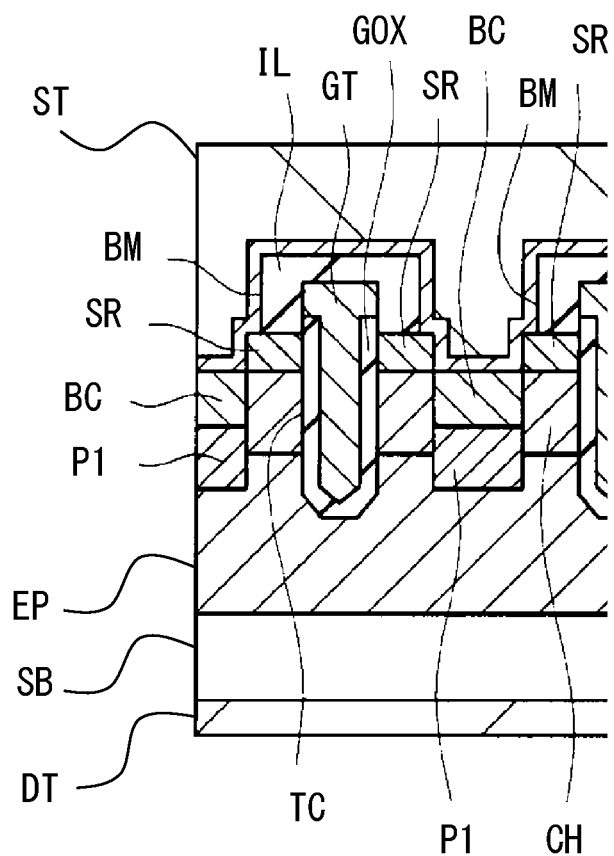
FIG. 10 is a sectional view showing a configuration example of a power transistor according to the first embodiment.

FIG. 10 shows a sectional structure of the power transistor 311 within the IPD chip CHP according to the first embodiment.

As shown in FIG. 10, a drain electrode (back surface electrode) DT is formed over the back surface of a silicon semiconductor substrate SB (semiconductor layer). The drain electrode DT functions as the drain of the power transistor 311. A current path is formed between the drain electrode DT and a source electrode ST through a channel region CH of the power transistor 311. An epitaxial layer EP serving as a drift region is formed on the semiconductor substrate SB. The substrate on which the epitaxial layer EP is formed (including the epitaxial layer EP) may be referred to as a semiconductor substrate.

A trench-gate type vertical MOSFET serving as the power transistor 311 is formed on the epitaxial layer EP. Specifically, a p-type semiconductor region (base diffusion region) P1 is formed on the epitaxial layer EP, and a body contact region BC is formed on the p-type semiconductor region P1. A source region SR is formed in a part of a region above the p-type semiconductor region and the body contact region BC.

A trench (gate trench) TC that reaches the epitaxial layer EP from the front surface side of the source region SR is formed. A gate electrode GT is formed in the trench TC through a gate insulating film GOX. A peripheral portion of the trench TC that is located below the source region SR corresponds to the channel region CH. An interlayer insulating film IL is formed so as to cover the trench TC (gate electrode GT) and the source region SR. The source electrode ST is formed above the interlayer insulating film IL through a barrier metal BM.

As described above, in the first embodiment, the semiconductor chip having the IPD function and the semiconductor chip having the MCU function are mounted in a package. With this configuration, the IPD and MCU functions can be implemented by one semiconductor device, which leads to a reduction in the number of components.

Furthermore, the temperature or current detected in the IPD chip is monitored by the MCU chip, which enables the MCU to appropriately control the operation of the power transistor.

(Second Embodiment)

A second embodiment will be described below with reference to the drawings. In the first embodiment, as shown in FIG. 4, the level shift circuits and the driver circuit need to be mounted on the ECU disposed outside the semiconductor device 200. In other words, in the first embodiment, the components, such as a transistor, a diode, and a resistor, which constitute the level shift circuits and the driver circuit, need to be mounted on the ECU. This leads to an increase in cost due to an increase in the number of components, which may result in an increase in the size of the substrate of the ECU. In this regard, according to the second embodiment, the number of components mounted on the ECU can be reduced.

Figure 11:
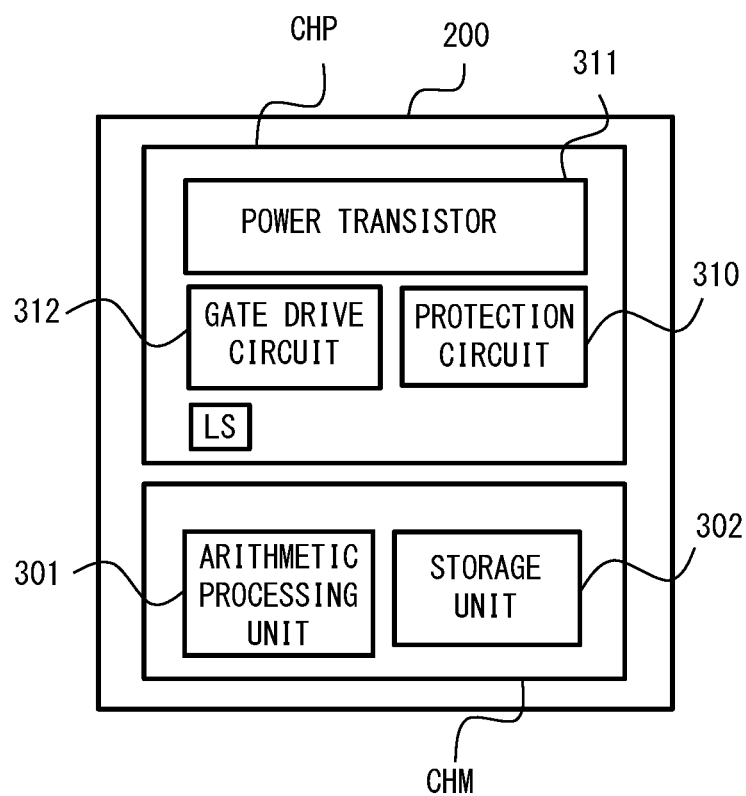
FIG. 11 is a block diagram showing an example of main components of a semiconductor device according to a second embodiment.
Figure 12:
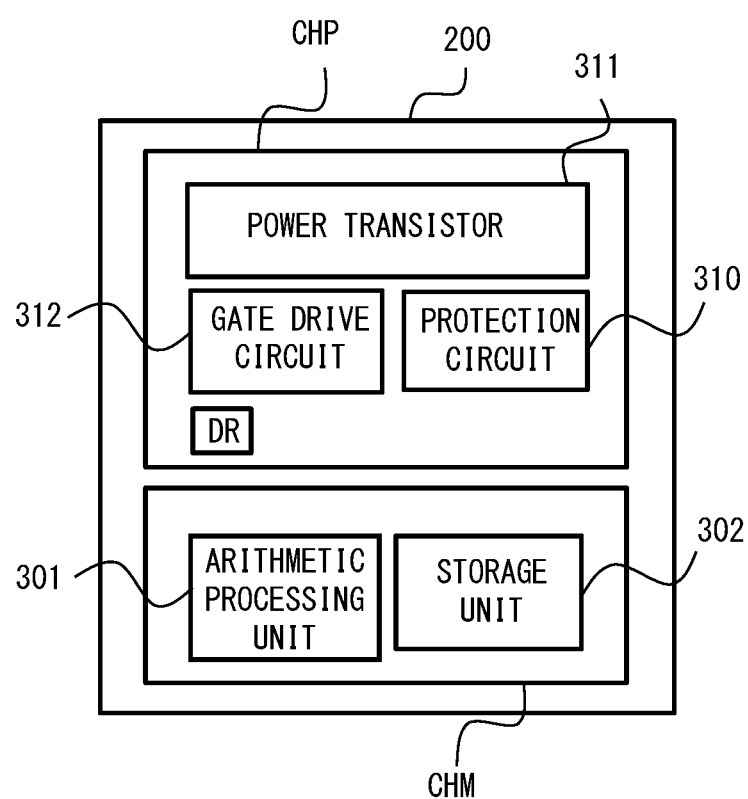
FIG. 12 is a block diagram showing another example of main components of the semiconductor device according to the second embodiment.

FIGS. 11 and 12 show examples of main components of the semiconductor device 200 according to the second embodiment. In the example shown in FIG. 11, in the semiconductor device 200, the IPD chip CHP includes a level shift circuit LS in addition to the components of the IPD chip CHP of the first embodiment shown in FIG. 5. The level shift circuit LS is a circuit that steps down the voltage of an externally input signal so that the signal is output to the MCU chip CHM. In the example shown in FIG. 12, in the semiconductor device 200, the IPD chip CHP includes a driver circuit DR in addition to the components of the IPD chip CHP of the first embodiment shown in FIG. 5. The driver circuit DR drives an external load with power consumption smaller than that of the external load driven by the power transistor 311.

Figure 13:
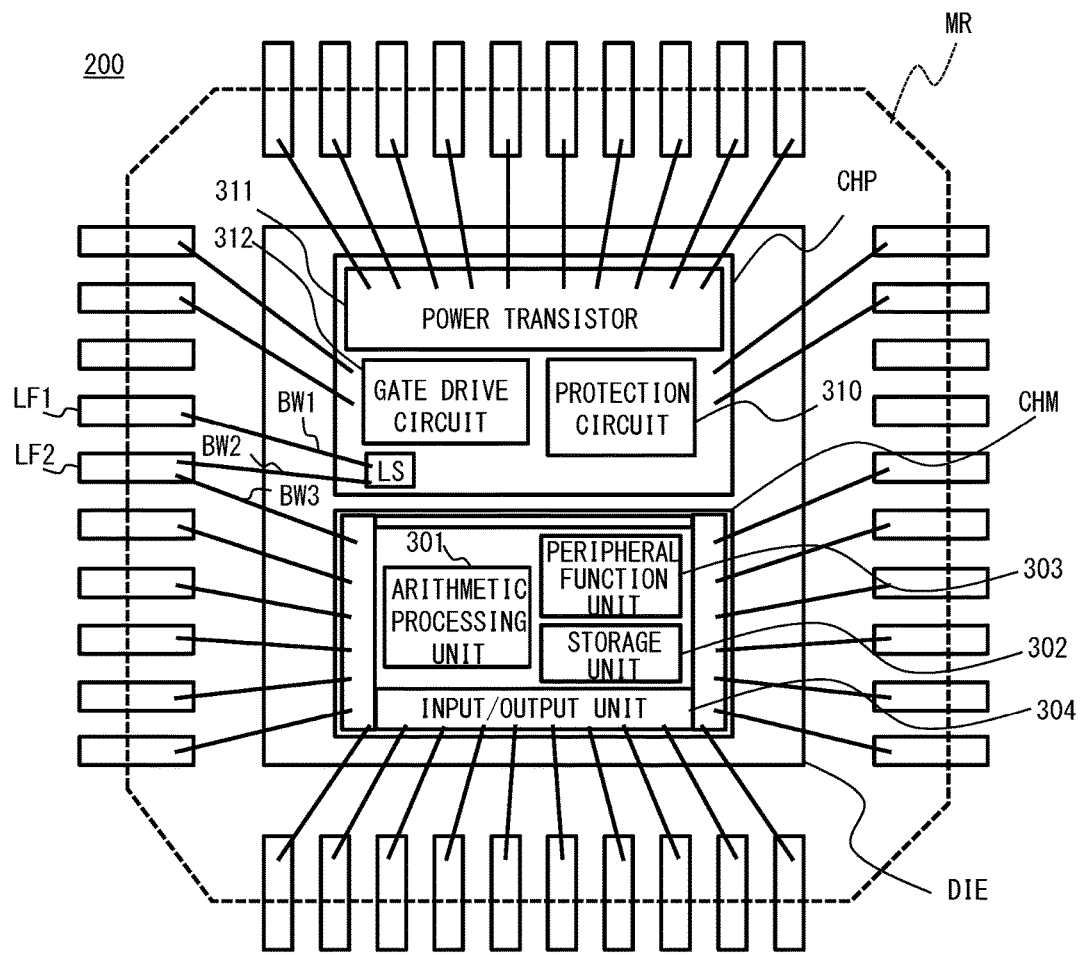
FIG. 13 is a plan view showing a schematic configuration of the semiconductor device according to the second embodiment.

FIG. 13 shows a schematic configuration of the semiconductor device 200 according to the second embodiment. As shown in FIG. 13, in the semiconductor device 200 according to the second embodiment, the IPD chip CHP includes the level shift circuit LS in addition to the components of the IPD chip CHP of the first embodiment shown in FIG. 6. The level shift circuit LS shown in FIG. 13 may be replaced by the driver circuit DR.

As shown in FIG. 6 of the first embodiment, the number of terminals of the IPD chip CHP is less than the number of terminals of the MCU chip CHM. When an SiP package having a certain number of terminals on each side thereof, such as a QFP (Quad Flat Package), is used for the semiconductor device, some terminals (lead frames LF) on the IPD chip CHP are redundant (unused).

Accordingly, in the second embodiment, as shown in FIG. 13, the level shift circuit and the driver circuit (requiring a breakdown voltage equal to a battery voltage) which are required in the vicinity of the MCU chip CHM are mounted on the IPD chip CHP using the redundant terminals on the IPD chip CHP.

As shown in FIG. 13, a terminal (output terminal) of the level shift circuit LS of the IPD chip CHP is connected to a lead frame LF1 with a bonding wire BW1. A terminal (input terminal) of the level shift circuit LS is connected to a lead frame LF2 with a bonding wire BW2, and a terminal (input/output terminal) of the MCU chip CHM is connected to the lead frame LF2 with a bonding wire BW3. In other words, the bonding wire BW2 and the bonding wire BW3 are bonded onto a terminal (lead frame) to connect the MCU chip CHM and the IPD chip CHP to each other.

Figure 14:
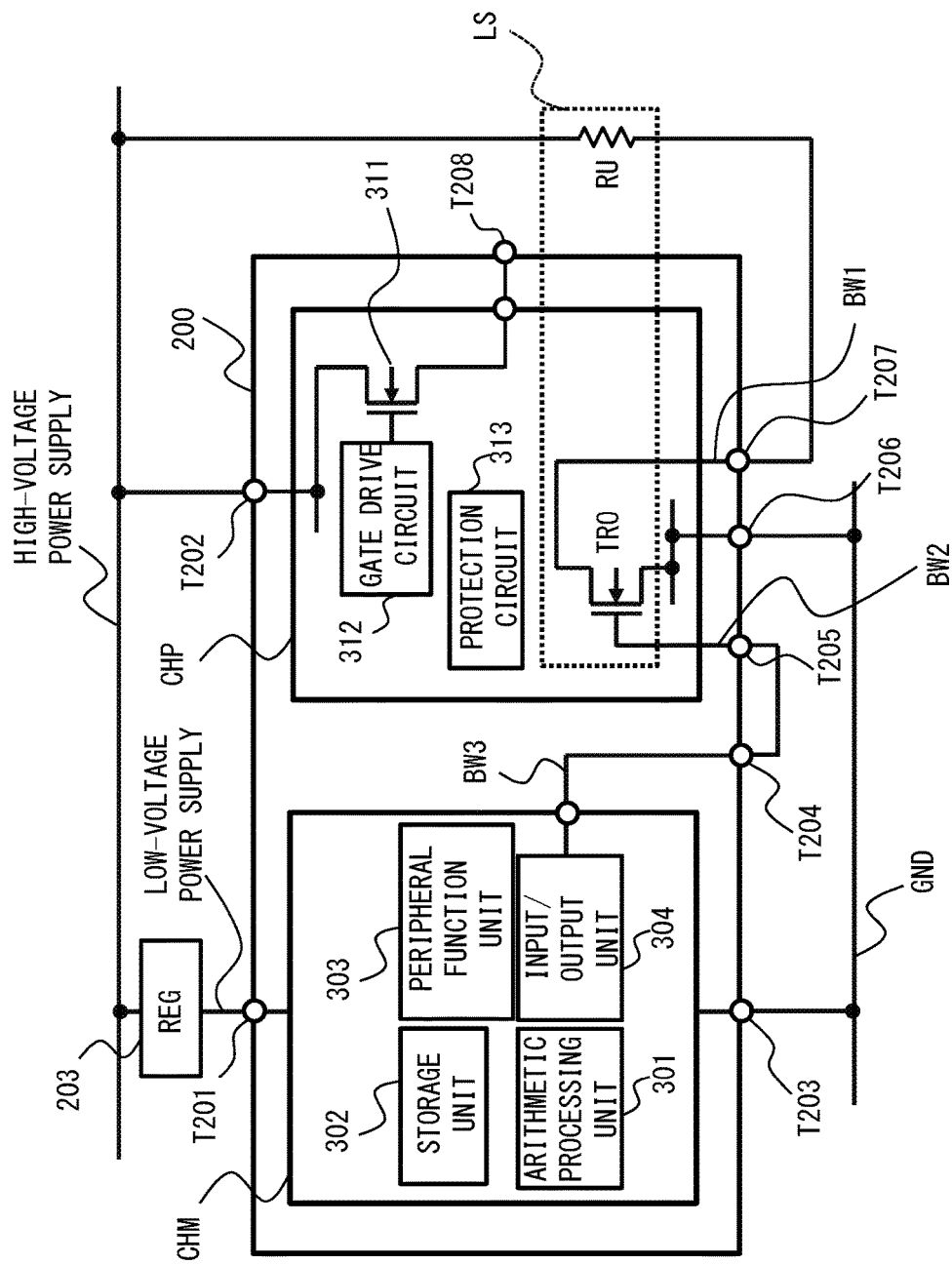
FIG. 14 is a block diagram showing a configuration example of the semiconductor device according to the second embodiment.

FIG. 14 shows a specific configuration example of the semiconductor device 200 according to the second embodiment. As shown in FIG. 14, in the semiconductor device 200 according to the second embodiment, the IPD chip CHP includes an Nch open drain TRO in addition to the components of the first embodiment, and a pull-up resistor RU is provided outside the semiconductor device 200 (is provided on the ECU). The other components of the second embodiment are similar to those of the first embodiment shown in FIGS. 8 and 9. The level shift circuit LS is composed of the Nch open drain TRO within the IPD chip CHP and the external pull-up resistor RU.

The semiconductor device 200 includes terminals T201 to T208 which are each formed of a lead frame. The MCU chip CHM is connected to the regulator 203 through the terminal T201, and the regulator 203 supplies low-voltage power to each part of the MCH chip CHM. The MCU chip CHM is connected to the GND through the terminal T203, and each part of the MCU chip CHM is grounded. The input/output unit 304 of the MCU chip CHM is connected to the I/O port terminal T204 (lead frame LF2) with the bonding wire BW3.

The IPD chip CHP is connected to the high-voltage power supply through the terminal T202, and high-voltage power is supplied to each part of the IPD chip CHP. In this example, high-voltage power is supplied to the power transistor 311 of the IPD chip CHP, and the power transistor 311 is connected to the terminal T208 to which a load is connected.

The IPD chip CHP is connected to the GND through the terminal T206, and each part of the IPD chip CHP is grounded. In this example, the source of the Nch open drain (Nch MOS transistor) TRO of the IPD chip CHP is grounded. The gate of the Nch open drain TRO is connected to the input terminal T205 (lead frame LF2) with the bonding wire BW2, and the drain of the Nch open drain TRO is connected to the output terminal T207 (lead frame LF1) with the bonding wire BW1. The terminal T204 and the terminal T205 are commonly connected to a terminal (lead frame LF2) as shown in FIG. 14. The pull-up resistor RU is connected to a node between the terminal T207 and the high-voltage power supply.

The level shift circuit LS switches the output level (shifted H/L) of the output terminal T207 according to the level (H/L) of the I/O port terminal T204 (output of the MCU chip). For example, when the output of the I/O port terminal T204, which is connected to the input/output unit 304 of the MCU chip CHM with the bonding wire BW3, is "L", the transistor of the Nch open drain TRO turns off. Accordingly, high-voltage power (battery power) is supplied to the output terminal T207. When the output of the I/O port terminal T204 is "H", the transistor of the Nch open drain TRO turns on. Accordingly, a GND potential is output to the output terminal T207. This configuration enables the level shift circuit LS to shift (boost) the level of a signal (3.3 V or 5 V, low-voltage signal) of the MCU chip, which is formed between the low-voltage power supply and the GND, to a signal (12 V, high-voltage signal) which is formed between the high-voltage power supply and the GND.

Note that the Nch open drain TRO can be used as a driver circuit. When the Nch open drain TRO is used not as a level shift circuit but as a driver circuit, a load (e.g., an LED or a buzzer) is connected to a node between the high-voltage power supply and the output terminal T207, instead of connecting the pull-up resistor.

When the functions of the level shift circuit and the driver circuit are not used, the output terminal T207 is opened and the I/O port terminal T204 is used as a normal terminal. Since only the gate of the Nch open drain TRO, which is mounted on the IPD chip CHP, is connected to the input terminal T205, the Nch open drain TRO can be used without inhibiting the function of the I/O port terminal T204. An ESD protection circuit may also be provided, and the ESD protection circuit may be designed with a breakdown voltage equal to or higher than a voltage assumed to be output from the I/O port terminal T204.

Figure 15:
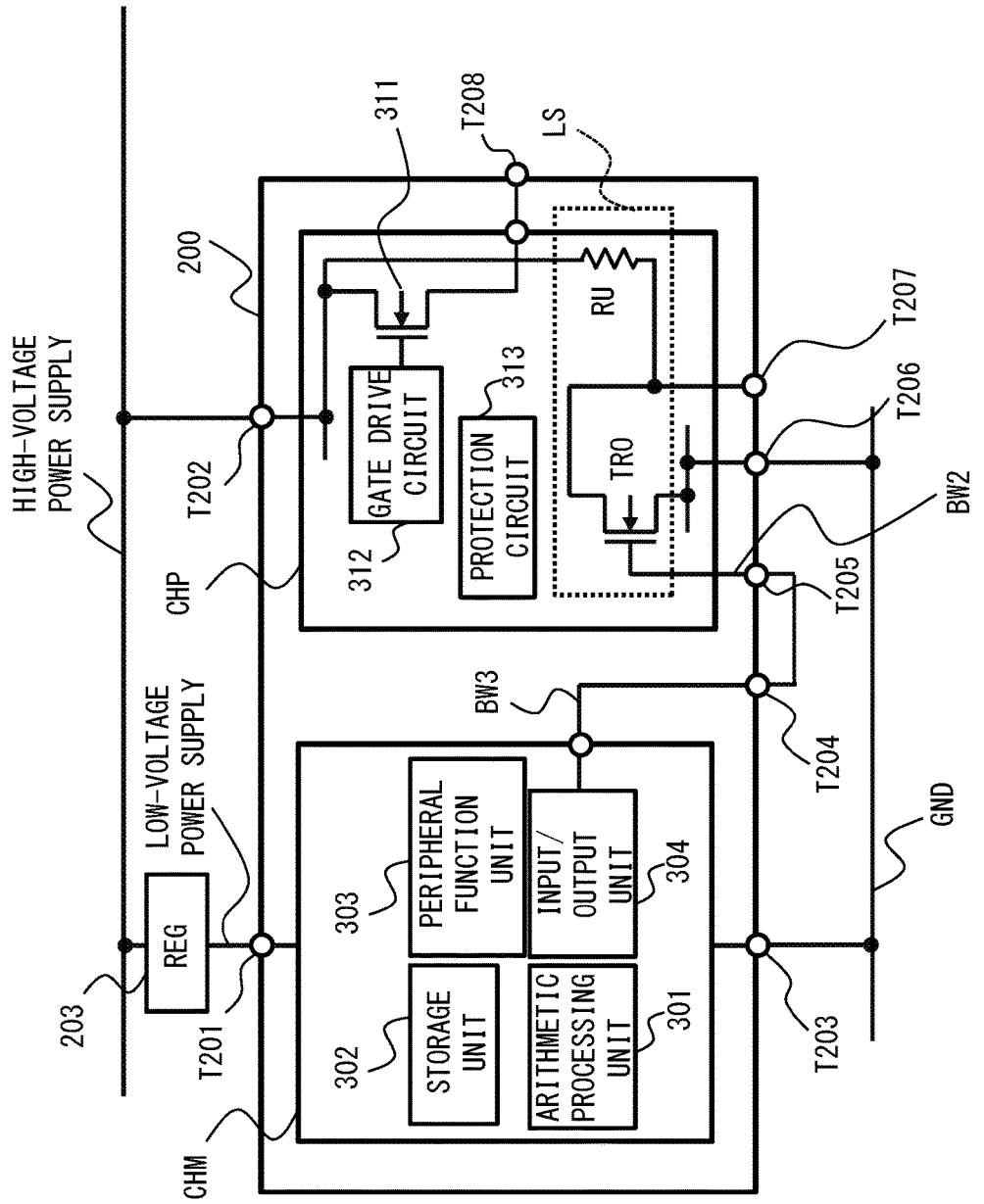
FIG. 15 is a block diagram showing another configuration example of the semiconductor device according to the second embodiment.

As shown in FIG. 15, the pull-up resistor may be incorporated in the IPD chip CHP. Referring to FIG. 15, the pull-up resistor RU is connected to a node between the terminal T207 and the terminal T202 in the IPD chip CHP. The incorporation of the pull-up resistor eliminates the need for an external resistor when the level shift circuit LS is used. In this case, the driver circuit cannot be used instead of the level shift circuit.

As described above, in the second embodiment, the level shift circuit and the driver circuit are mounted on the IPD chip in the SiP in which the MCU chip and the IPD chip are included in one package, and the peripheral functions, such as the level shift circuit and the driver circuit, which are required for the MCU, are incorporated and provided in one package. The incorporation of the peripheral components, such as the level shift circuit and the driver circuit, leads to a reduction in the substrate size due to a reduction in the mounting area and simplification of wiring, as well as a reduction in cost due to a reduction in the number of components.

Figure 16:
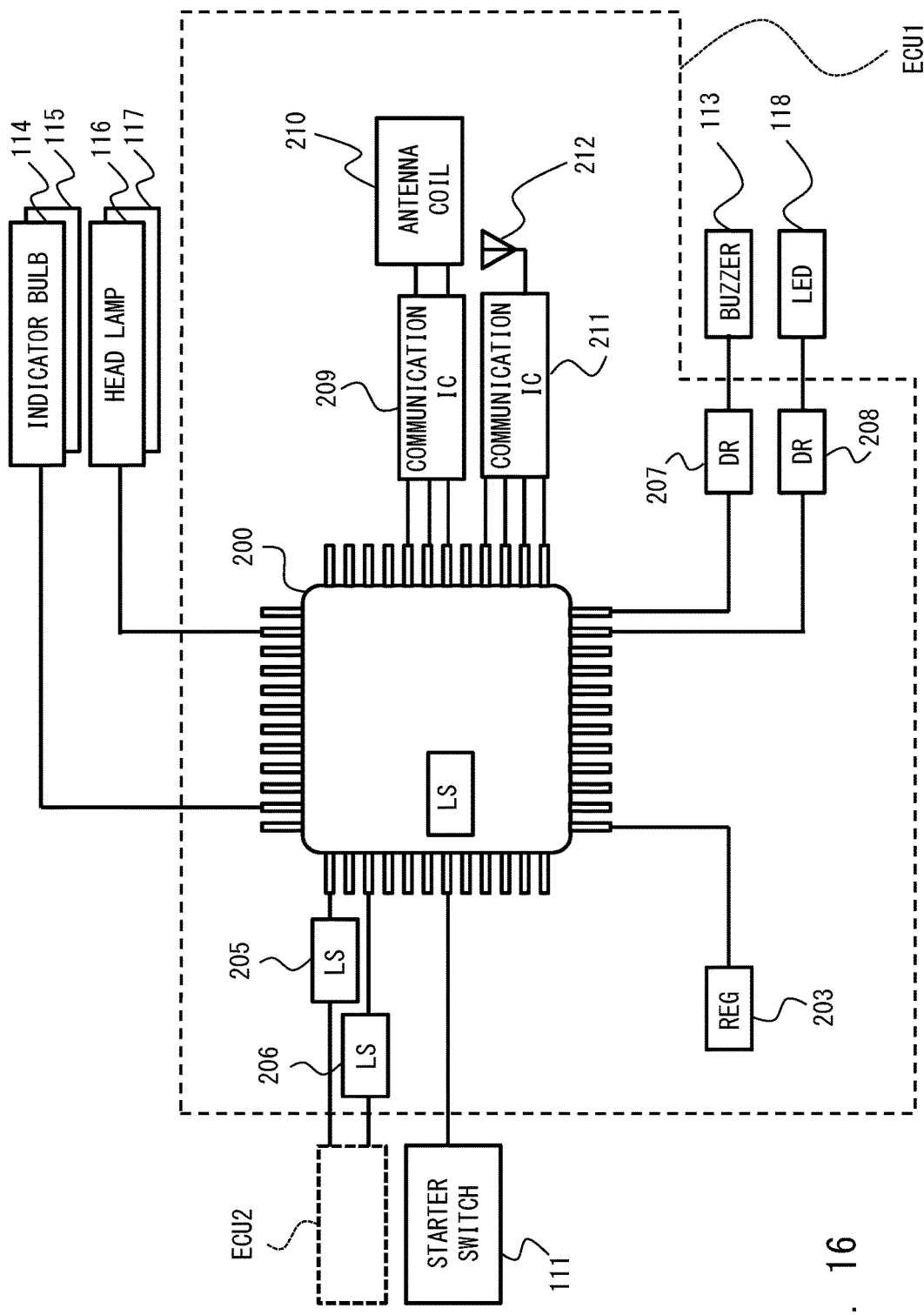
FIG. 16 is a block diagram showing an example of application of an electronic control unit according to the second embodiment.
Figure 17:
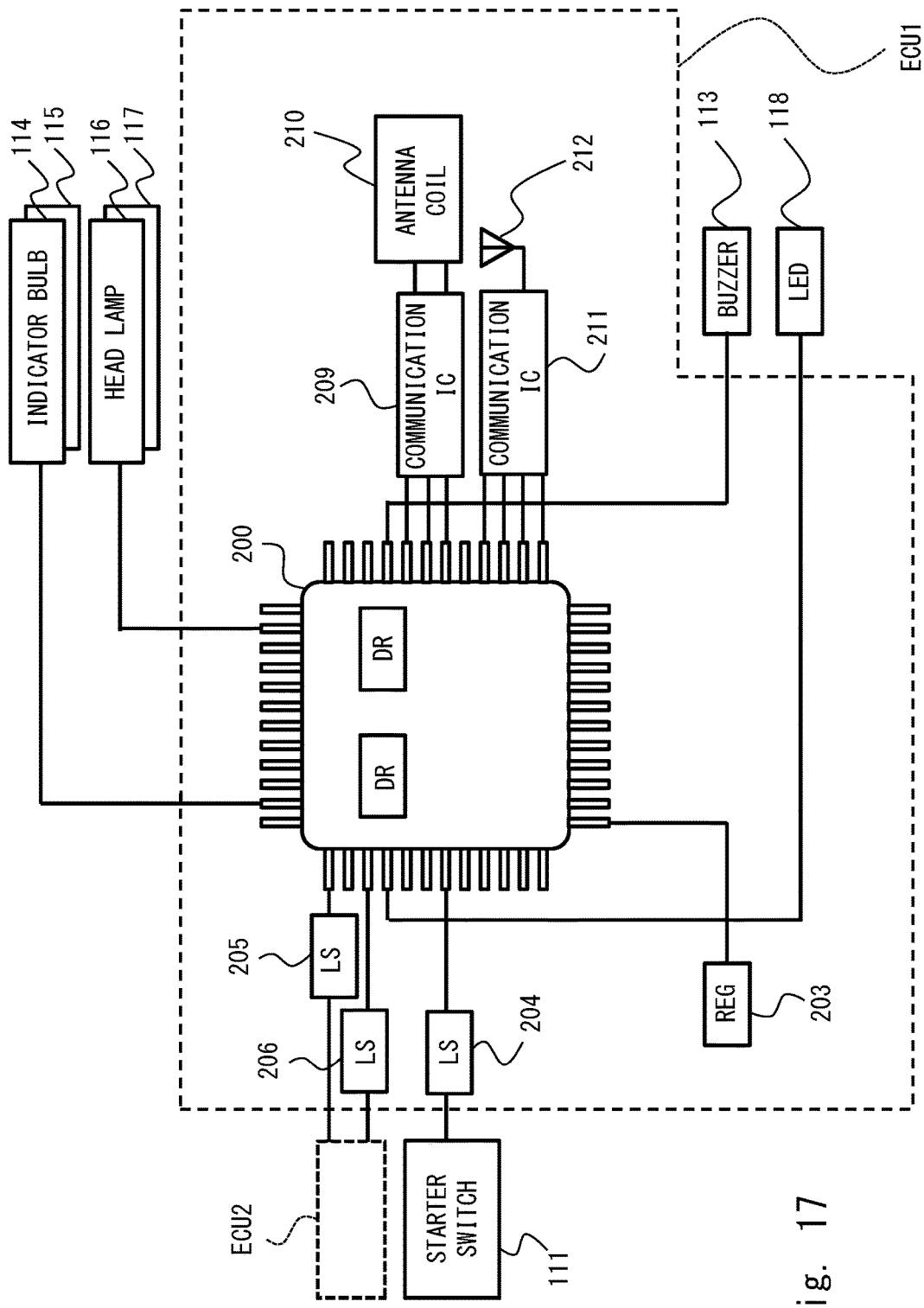
FIG. 17 is a block diagram showing another example of application of the electronic control unit according to the second embodiment.

For example, FIGS. 16 and 17 show examples in which the second embodiment is applied to the configuration of the first embodiment shown in FIG. 4. In the example shown in FIG. 16, the level shift circuit, which is disposed between the semiconductor device and the starter switch 111, is incorporated in the semiconductor device, thereby eliminating the need for mounting the transistors constituting the level shift circuit, or transistors and resistors, on the ECU. In the example shown in FIG. 17, two driver circuits, which are disposed between the semiconductor device and the buzzer 113 and the LED 118, respectively, are incorporated in the semiconductor device, thereby eliminating the need for mounting the transistors constituting the two driver circuits on the ECU.

(Modified Example 1 of the Second Embodiment)

The second embodiment illustrates an example in which the level of the signal is boosted from the low-voltage signal to the high-voltage signal. Alternatively, a configuration in which the level of the signal is stepped down from the high-voltage signal to the low-voltage signal may be employed.

Figure 18:
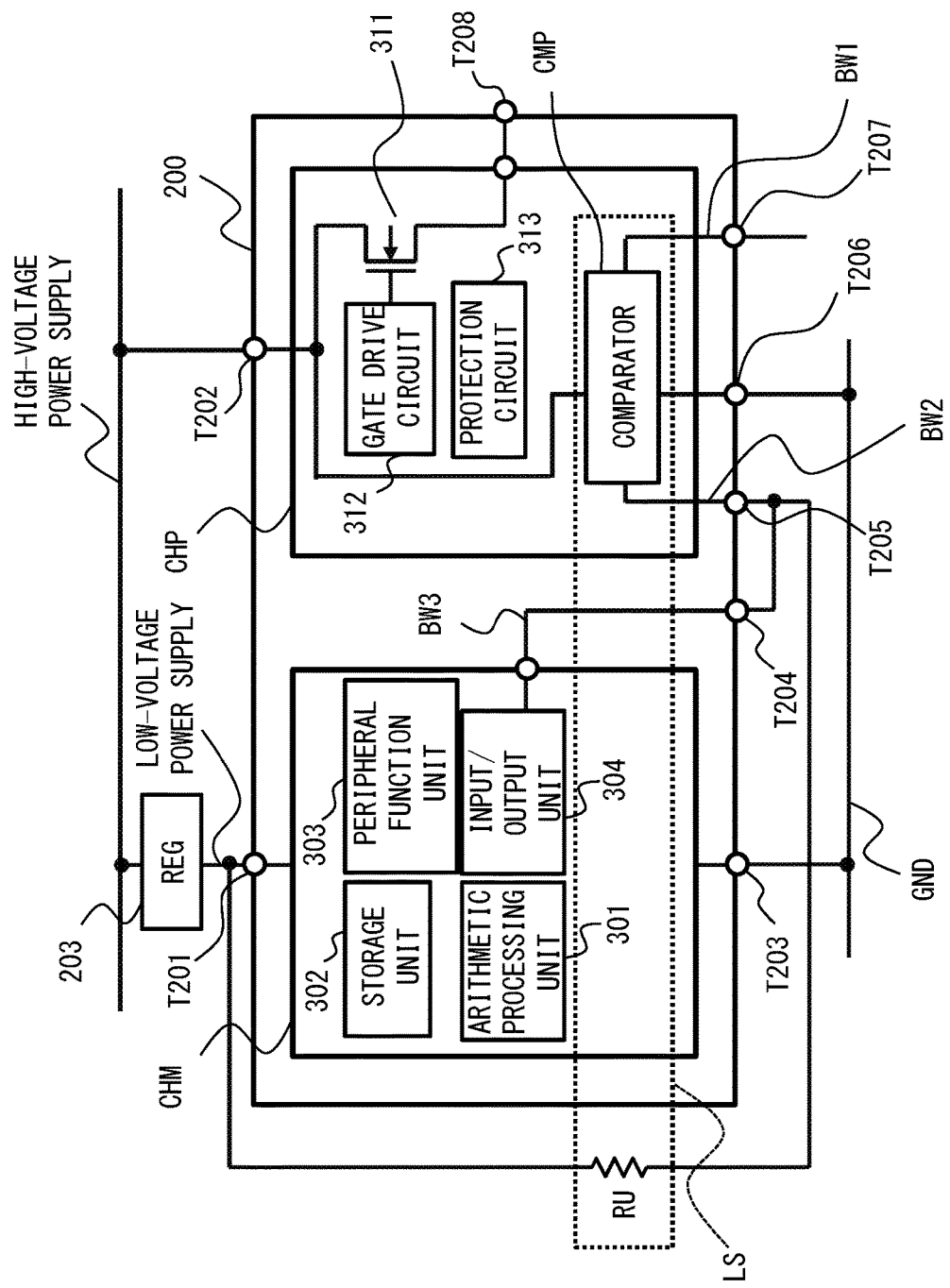
FIG. 18 is a block diagram showing a configuration example of a semiconductor device according to Modified Example 1 of the second embodiment.

FIG. 18 shows a configuration example of the semiconductor device 200 according to Modified Example 1 of the second embodiment. As shown in FIG. 18, Modified Example 1 differs from the configuration of the second embodiment shown in FIG. 14 in that a comparator CMP is mounted in the IPD chip CHP and the pull-up resistor RU is connected to a node between the terminal T205 and the regulator 203. Note that the pull-up resistor RU may be incorporated in the IPD chip, like in the second embodiment.

The comparator CMP receives, at the input terminal T207, the signal formed between the high-voltage power supply and the GND. The pull-up resistor RU is disposed between the output terminal T205 and the low-voltage power supply. Accordingly, the comparator CMP shifts (steps down) the level of a signal (12 V, high-voltage signal) of the terminal T207 to a signal (3.3 V or 5 V, low-voltage signal) formed between the low-voltage power supply and the GND.

The I/O port terminal T204 and the output terminal T205, which are connected to the input/output unit 304 of the MCU chip CHM, are bonded onto a terminal (lead frame) in the same manner as in the second embodiment. This configuration enables the MCU chip CHM to directly monitor the level-shifted signal of the terminal T205. Like in the second embodiment, the output terminal T205 and the I/O port terminal T204 are bonded onto a terminal and used as a dual-purpose terminal. Thus, only by increasing the number of input terminals T207, the level of an external signal formed between the high-voltage power supply and the GND can be shifted to the level of a signal formed between the low-voltage power supply and the GND, and the signal level can be directly monitored by the MCU chip CHM.

Figure 19:
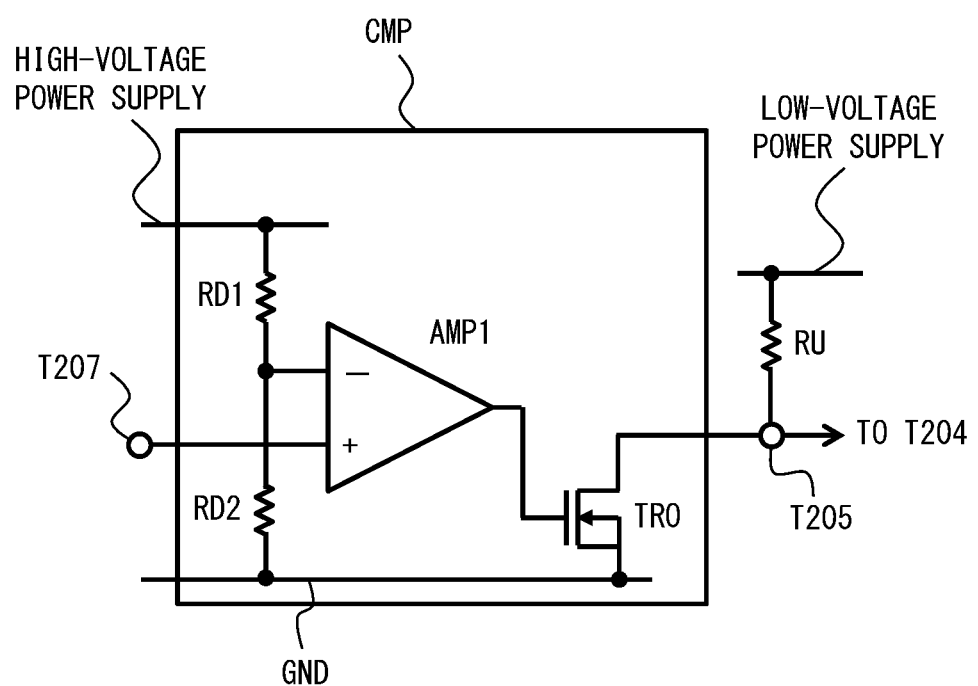
FIG. 19 is a circuit diagram showing a configuration example of a comparator according to Modified Example 1 of the second embodiment.

FIG. 19 shows a detailed configuration of the comparator CMP shown in FIG. 18. As shown in FIG. 19, the comparator CMP includes a differential amplifier AMP1, voltage-dividing resistors RD1 and RD2, and the Nch open drain TRO.

The voltage-dividing resistor RD1 and the voltage-dividing resistor RD2 are connected in series between the high-voltage power supply and the GND. A non-inverting input terminal (+ input terminal) of the differential amplifier AMP1 is connected to the input terminal T207, and an inverting input terminal (− input terminal) of the differential amplifier AMP1 is connected to a node between the voltage-dividing resistor RD1 and the voltage-dividing resistor RD2. The inverting input terminal receives a voltage determined by the voltage-dividing resistor RD1 and the voltage-dividing resistor RD2 between the high-voltage power supply and the GND. For countermeasures against noise, the divided voltage is preferably designed to have a median between the high-voltage power and the GND, by setting the voltage-dividing resistor RD1 and the voltage-dividing resistor RD2 to the same resistance value. Further, it is more effective to provide a filter effect by, for example, making the response of the comparator CMP slower, which contributes to preventing chattering of the signal input to the input terminal T207.

Like in the second embodiment, the Nch open drain TRO is connected to a node between the pull-up resistor RU and the GND, and the gate of the Nch open drain TRO is connected to the output terminal of the differential amplifier AMP1. Like in the second embodiment, the Nch open drain TRO mounted in the IPD chip CHP and the pull-up resistor RU disposed between the low-voltage power supply and the output terminal T205 shift the level of the signal of the T207 to the level of the signal formed between the low-voltage power supply and the GND.

In this example, when "H: high-voltage power supply level" is input to the input terminal T207, the differential amplifier AMP1 outputs "H" as a result of comparing the signal of the input terminal T207 with the divided voltage. Accordingly, the Nch open drain TRO turns on and "L: GND level" is output to the output terminal T205. When "L: GND level" is input to the input terminal T207, the differential amplifier AMP1 outputs "L" as a result of comparing the signal of the input terminal T207 with the divided voltage. Accordingly, the Nch open drain TRO turns off and "H: high-voltage power supply level" is output to the output terminal T205. That is, the comparator CMP has an inverting output configuration in which a signal inverted from the input signal is output.

For example, assuming a switch input to the input terminal T207 (the input terminal T207 indicates "H" when the switch is ON), the Nch open drain TRO turns off in the state where the switch is OFF (the input terminal T207 indicates "L"), and thus no current flows to the output terminal T205. This configuration is preferable in terms of current consumption.

Further, in a case where the non-inverting input terminal (+ input terminal) of the differential amplifier AMP1 is provided with a pull-down resistor, when the input terminal T207 is opened, the Nch open drain TRO turns off. Accordingly, when the level shift circuit is not used, the output terminal T205 can be used as a normal I/O port terminal.

Figure 20:
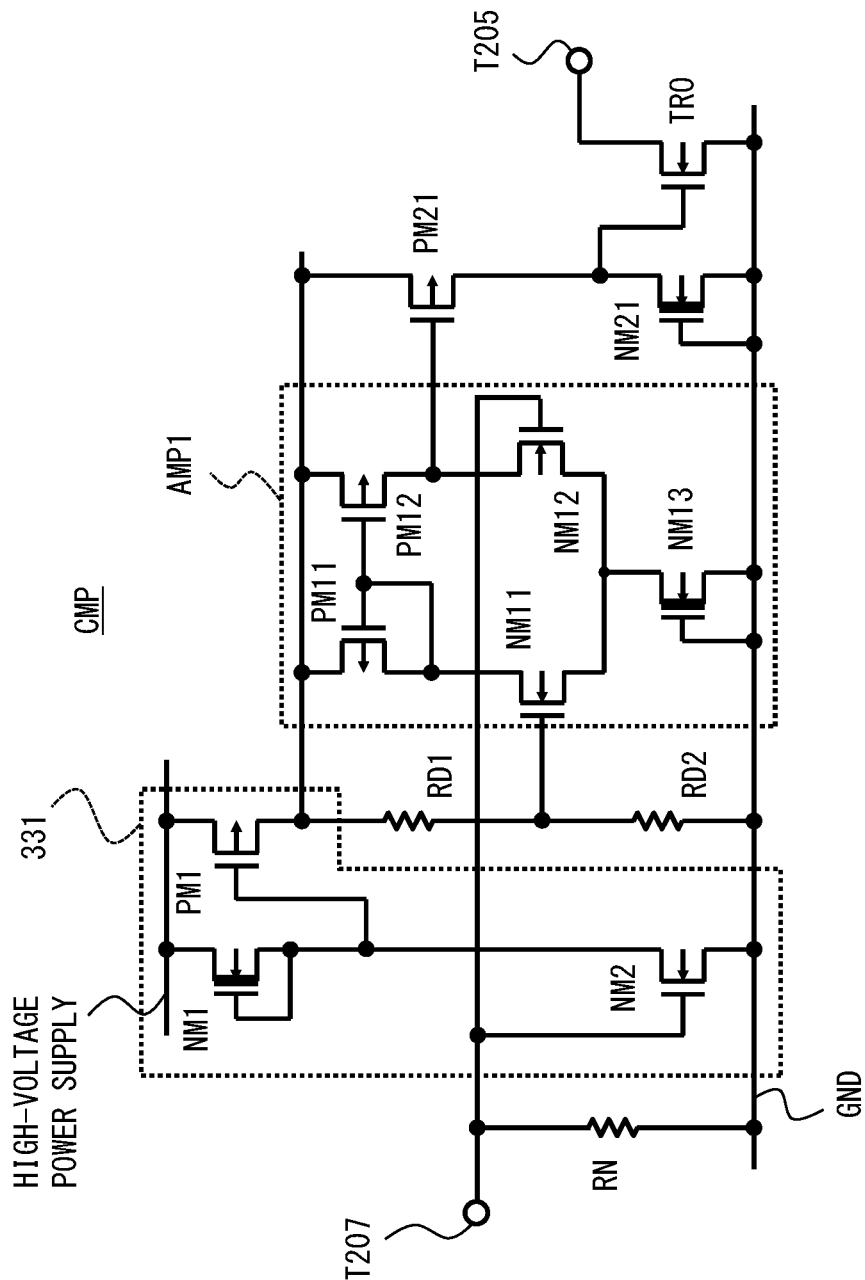
FIG. 20 is a circuit diagram showing a detailed configuration example of the comparator according to Modified Example 1 of the second embodiment.

FIG. 20 shows a more detailed configuration example of the comparator CMP shown in FIG. 19. In the example shown in FIG. 20, the comparator CMP includes a dark current countermeasure unit 331 to eliminate the circuit current during non-operation of the comparator CMP.

As shown in FIG. 20, the comparator CMP includes a pull-down resistor RN, the dark current countermeasure unit 331, the voltage-dividing resistors RD1 and RD2, the differential amplifier AMP1, a Pch MOS transistor PM21, an Nch MOS transistor NM21, and the Nch open drain TRO. The dark current countermeasure unit 331 includes Nch MOS transistors NM1 and NM2 and a Pch MOS transistor PM1. The differential amplifier AMP1 includes Pch MOS transistors PM11 and PM12 and Nch MOS transistors NM11 to NM13.

The pull-down resistor RN is connected to a node between the terminal T207 and the GND. The Nch MOS transistors NM1 and NM 2 are connected in series between the high-voltage power supply and the GND. The gate and the source of the Nch MOS transistor NM1 are commonly connected, and the gate of the Nch MOS transistor NM2 is connected to the terminal T207. The Pch MOS transistor PM1 and the voltage-dividing resistors RD1 and RD2 are connected in series between the high-voltage power supply and the GND. The gate of the Pch MOS transistor PM1 is connected to the source of the Nch MOS transistor NM1.

The Pch MOS transistor PM11 and the Nch MOS transistor NM11, which are connected in series, and the Pch MOS transistor PM12 and the Nch MOS transistor NM12, which are connected in series, are connected in parallel to the drain of the Pch MOS transistor PM1. The gates of the Pch MOS transistor PM11 and the Pch MOS transistor PM12 are connected to each other, and an intermediate node between the gates is connected to the drain of the Pch MOS transistor PM11.

The gate of the Nch MOS transistor NM11 serves as the inverting input terminal of the differential amplifier AMP1, and is connected to an intermediate node between the voltage-dividing resistors RD1 and RD2. The gate of the Nch MOS transistor NM12 serves as the non-inverting input terminal of the differential amplifier AMP1, and is connected to the terminal T207. The sources of the Nch MOS transistor NM11 and the Nch MOS transistor NM12 are commonly connected to the drain of the Nch MOS transistor NM13, and the gate and the source of the Nch MOS transistor NM13 are connected to the GND.

The Pch MOS transistor PM21 and the Nch MOS transistor NM21 are connected in series between the drain of the Nch MOS transistor NM1 and the GND. The gate of the Pch MOS transistor PM21 is connected to the drain (output terminal) of the Pch MOS transistor PM12, and the gate of the Nch MOS transistor NM21 is connected to the GND. The gate of the Nch open drain TRO is connected to an intermediate node between the Pch MOS transistor PM21 and the Nch MOS transistor NM21.

When "H" is input to the input terminal T207, the Nch MOS transistor NM2 turns on. Then, the Pch MOS transistor PM1 turns on, so that the high-voltage power is supplied to the differential amplifier AMP1 and the voltage-dividing resistors RD1 and RD2. Accordingly, the divided voltage between the voltage-dividing resistor RD1 and the voltage-dividing resistor RD2 is compared with the voltage of the input terminal T207, and the comparison result is output to the gate of the Nch open drain TRO.

When "L: GND potential" is input to the input terminal T207, the Nch MOS transistor NM2 turns off and the Pch MOS transistor PM1 also turns off. As a result, no power is supplied to the differential amplifier AMP1 and the voltage-dividing resistors RD1 and RD2. Accordingly, "L: GND potential" is output to the gate of the Nch open drain TRO. Thus, when "L: GND potential" is input to the input terminal T207, all paths connected to the GND are cut off, so that no dark current flows in the non-active state (input terminal T207=L). Like in the second embodiment, an ESD protection circuit may be provided, and the ESD protection circuit may be designed with a breakdown voltage equal to or higher than a voltage assumed to be output from the I/O port terminal T204.

In this manner, the comparator is provided as the level shift circuit to be mounted on the IPD chip within the semiconductor device, thereby achieving the configuration for shifting the level of power from the high-voltage power to the low-voltage power. This configuration eliminates the need for mounting the transistors constituting the level shift circuit, or transistors and resistors, on the ECU.

(Modified Example 2 of the Second Embodiment)

Figure 21:
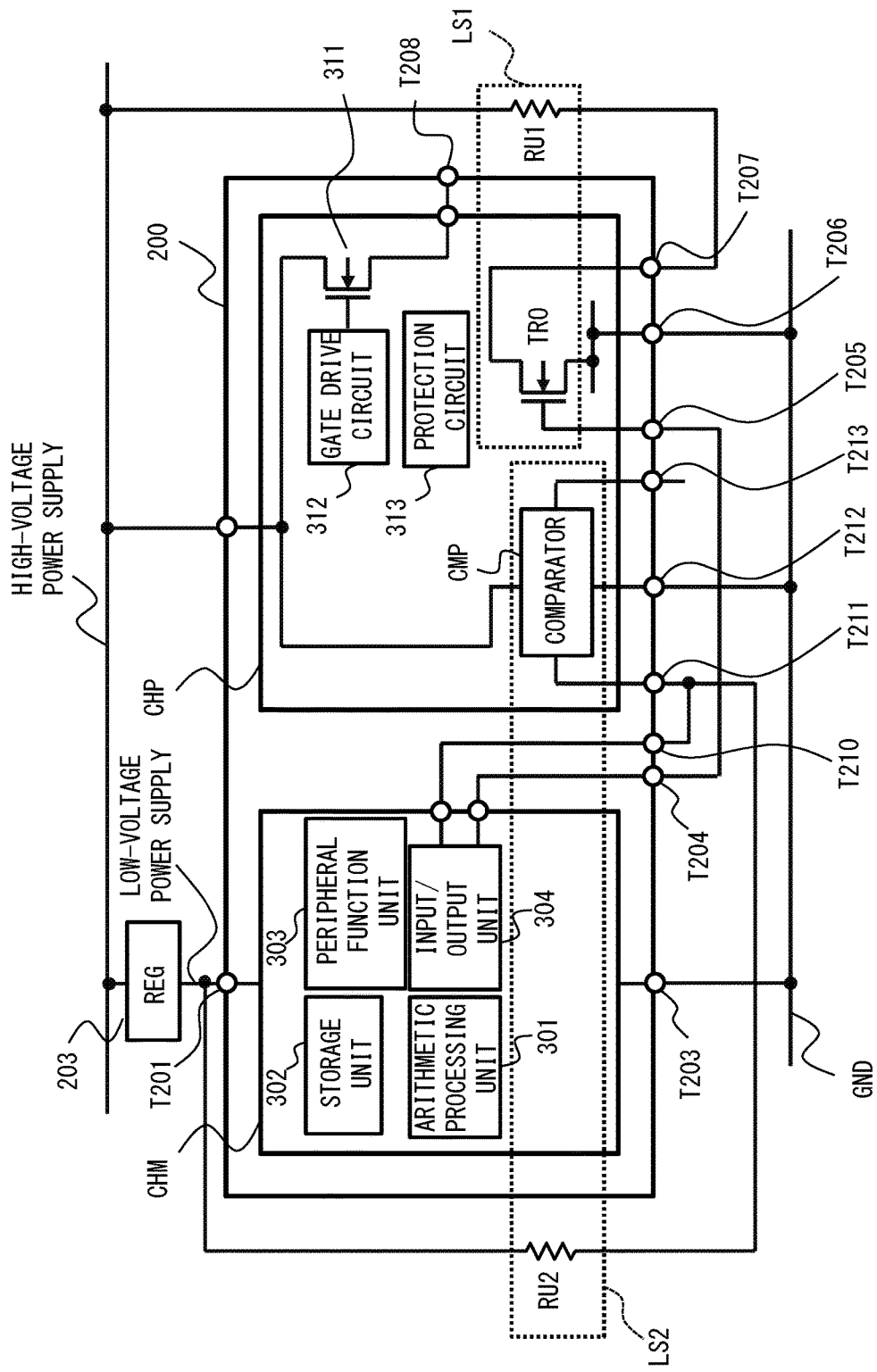
FIG. 21 is a block diagram showing a configuration example of a semiconductor device according to Modified Example 2 of the second embodiment.

The level shift circuit of the second embodiment and the level shift circuit of Modified Example 1 may be incorporated in the IPD chip. FIG. 21 shows a configuration example of the semiconductor device 200 according to Modified Example 2 of the second embodiment.

As shown in FIG. 21, Modified Example 2 includes a level shift circuit LS1 which is similar to the level shift circuit of the second embodiment shown in FIG. 14, and a level shift circuit LS2 which is similar to the level shift circuit of Modified Example 1 shown in FIG. 18. Like in the second embodiment, the level shift circuit LS1 includes the Nch open drain TRO within the IPD chip CHP and an external pull-up resistor RU1. Like in Modified Example 1, the level shift circuit LS2 includes the comparator CMP within the IPD chip CHP and an external pull-up resistor RU2.

In Modified Example 1, the input/output unit 304 and the comparator CMP are connected to each of the terminals T204 to T207, whereas in Modified Example 2 in which two level shift circuits are used, the input/output unit 304 and the comparator CMP are connected to each of terminals T210 to T213.

Thus, the semiconductor device can be configured in such a manner that the level shift circuit or driver circuit that shifts the level of power from the low-voltage power to the high-voltage power, as well as the level shift circuit that shifts the level of power from the high-voltage power to the low-voltage power can be included in the IPD chip within the semiconductor device. With this configuration, a plurality of level shift circuits can be incorporated, which leads to a further reduction in the number of components.

Figure 22:
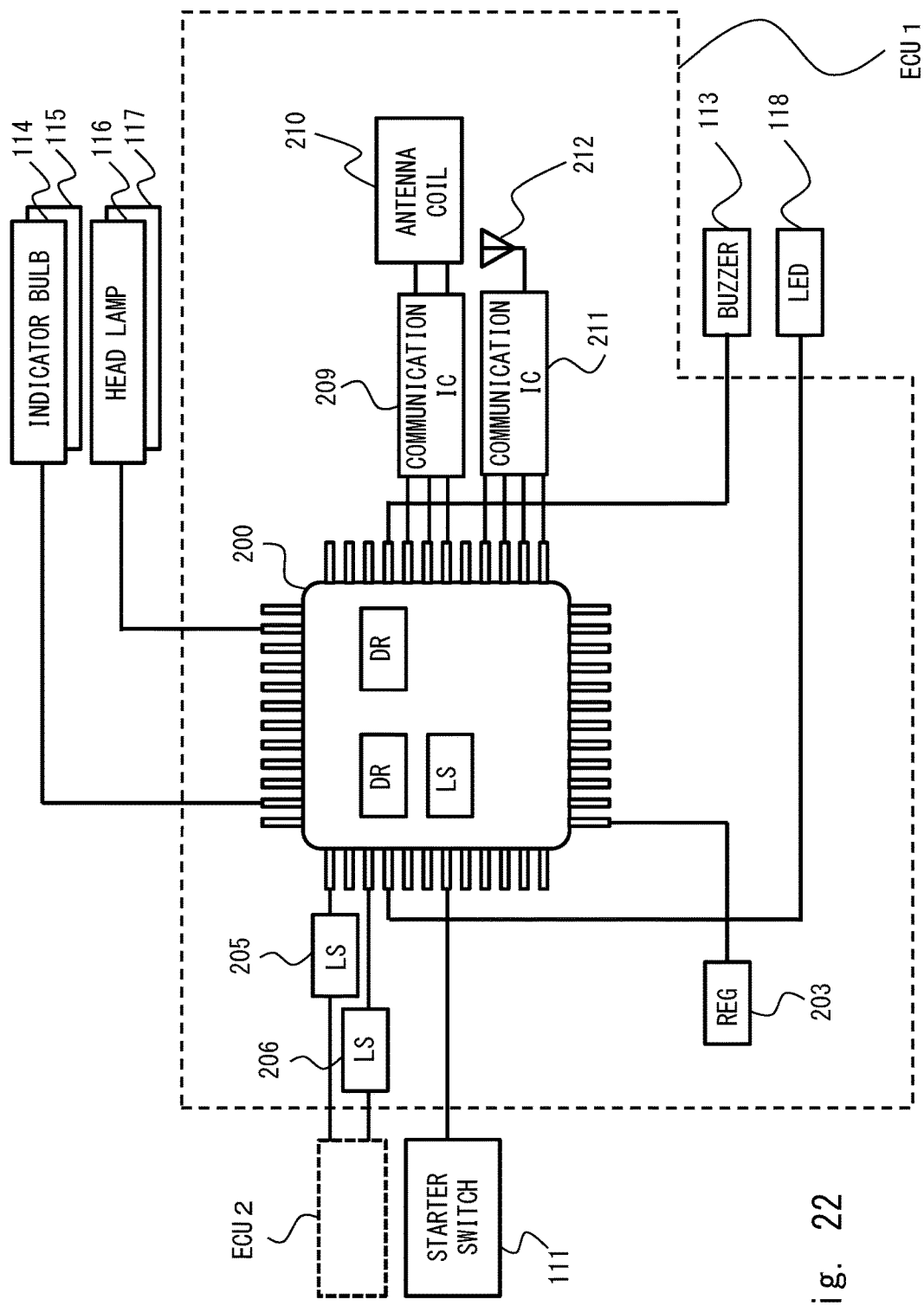
FIG. 22 is a block diagram showing an example of application of an electronic control unit according to Modified Example 2 of the second embodiment.

For example, FIG. 22 shows an example in which Modified Example 2 is applied to the configuration of the first embodiment shown in FIG. 4. In the example shown in FIG. 22, the level shift circuit disposed between the semiconductor device and the starter switch 111 and two driver circuits disposed between the semiconductor device and the buzzer 113 and the LED 118, respectively, are incorporated in the semiconductor device. This configuration eliminates the need for mounting the transistors constituting the level shift circuit and two driver circuits, or transistors and resistors, on the ECU.

(Modified Example 3 of the Second Embodiment)

Figure 23:
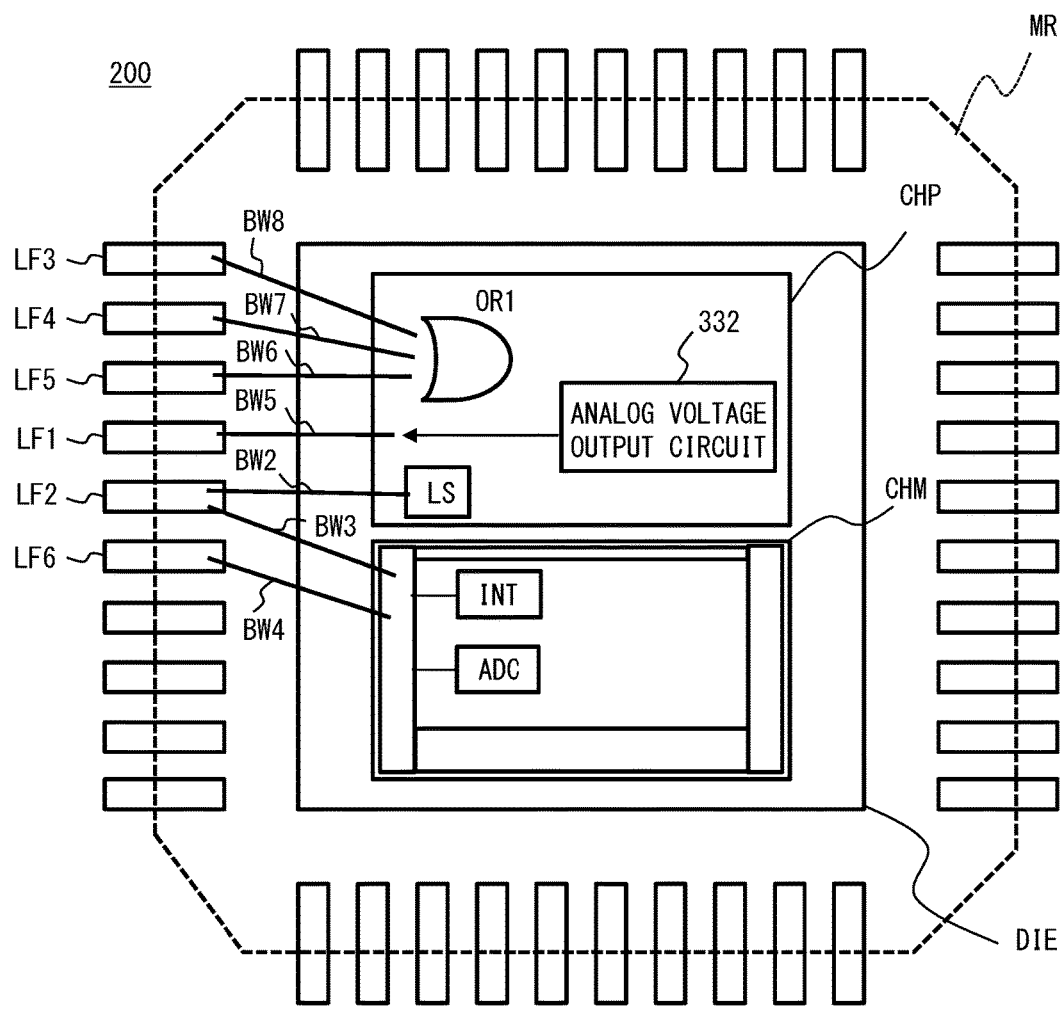
FIG. 23 is a plan view showing a schematic configuration of a semiconductor device according to Modified Example 3 of the second embodiment.

The semiconductor device may have a configuration in which signals from a plurality of input terminals are input to the comparator of Modified Example 1. FIG. 23 is a plan view showing a schematic configuration of the semiconductor device 200 according to Modified Example 3 of the second embodiment. FIG. 23 schematically shows the arrangement of the components within the respective semiconductor chips, and illustrates only the parts necessary for the explanation. Reference symbols "INT" and "ADC" in the MCU chip CHM denote an interrupt control and an analog-to-digital conversion, respectively, in the peripheral function unit. FIG. 23 illustrates only the parts necessary for the explanation of the bonding wires BW.

In the example of FIG. 23, the IPD chip CHP includes a 3-input OR circuit OR1 and an analog voltage output circuit 332 in addition to the components of Modified Example 1. A terminal (output terminal) of the level shift circuit LS is connected to the lead frame LF1 with the bonding wire BW1. The input terminals of the 3-input OR circuit OR1 are connected to lead frames LF3 to LF5 with bonding wires BW6 to BW8, respectively. The output terminal of the analog voltage output circuit 332 is connected to the lead frame LF1 with a bonding wire BW5.

Like in the first embodiment, the terminal (output terminal) of the level shift circuit LS is connected to the lead frame LF2 with the bonding wire BW2, and the terminal (input/output terminal) of the MCU chip CHM (INT) is connected to the lead frame LF2 with the bonding wire BW3, and thus the lead frame LF2 serves as a dual-purpose terminal. The terminal (input/output terminal) of the MCU chip CHM (ADC) is connected to a lead frame LF6 with a bonding wire BW4.

The bonding wire BW4 is connected to the analog-to-digital conversion unit ADC on the MCU chip. The terminal of the analog-to-digital conversion unit ADC connected to the bonding wire BW4 and the terminal connected to the bonding wire BW5 are connected together on the PCB (printed circuit board) of the ECU, thereby allowing the analog-to-digital conversion unit ADC to monitor the output of the analog voltage output circuit.

Figure 24:
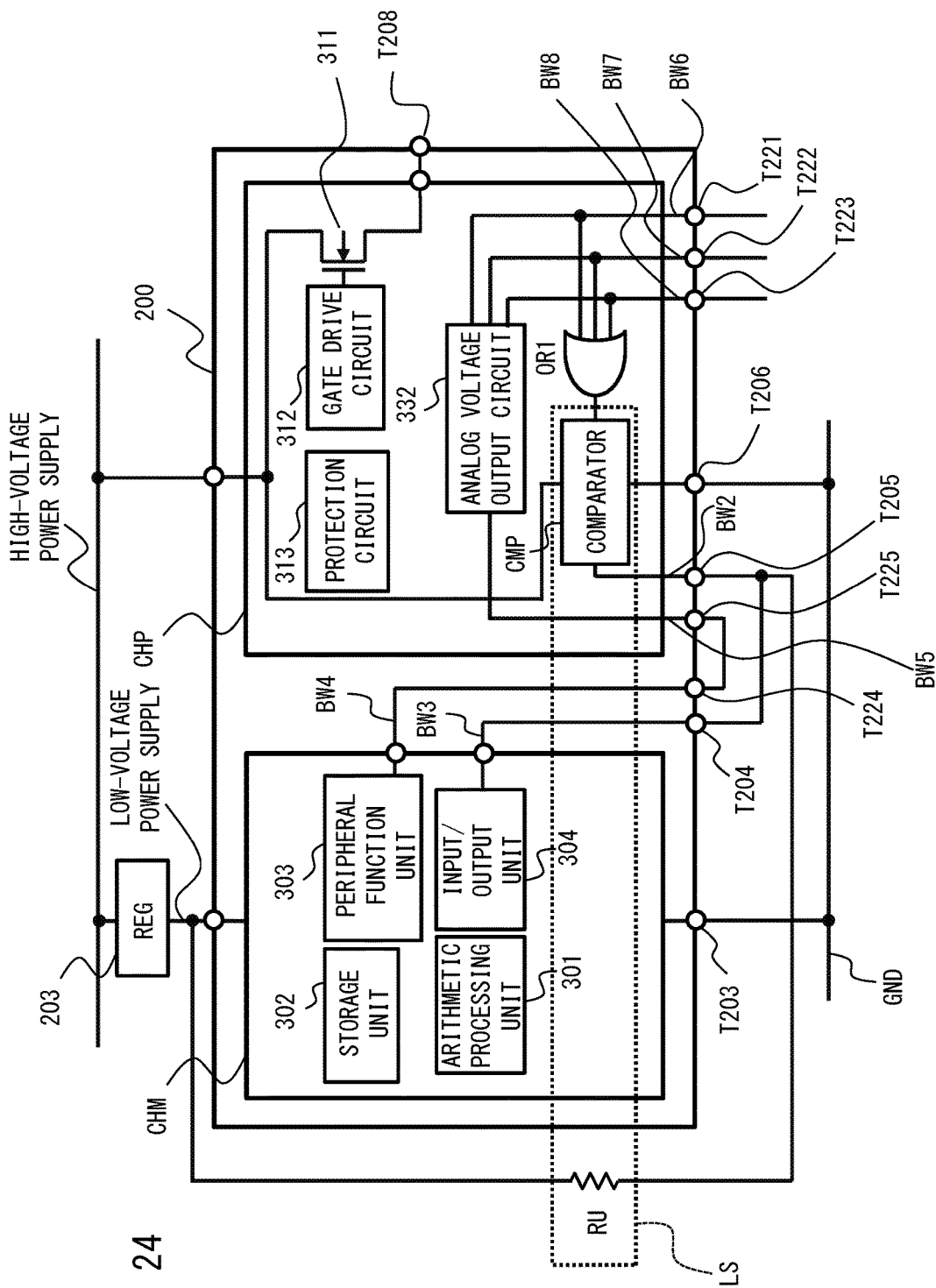
FIG. 24 is a block diagram showing a configuration example of the semiconductor device according to Modified Example 3 of the second embodiment.

FIG. 24 shows a configuration example of the semiconductor device 200 according to Modified Example 3 of the second embodiment. As shown in FIG. 24, in Modified Example 3, the comparator CMP, the 3-input OR circuit OR1, and the analog voltage output circuit 332 are mounted in the IPD chip CHP, and the pull-up resistor RU is connected to a node between the terminal T205 and the regulator 203.

Signals are input to the 3-input OR circuit OR1 from input terminals T221 to T223 (lead frames LF3 to LF5), and the OR operation result of the 3-input OR circuit OR1 is input to the comparator CMP. Like in Modified Example 1, the pull-up resistor RU is connected to the comparator CMP through the output terminal T205. The I/O port terminal T204 and the output terminal T205, which are connected to the input/output unit 304 on the MCU chip CHM, are bonded onto a terminal (lead frame) in the same manner as in Modified Example 1. The analog voltage output circuit 332 receives the signals from the input terminals T221 to T223, and outputs an analog voltage corresponding to the input signals to an output terminal T225. An I/O port terminal (AD converter terminal) T224 (lead frame LF6) and the output terminal T225 (lead frame LF1) which are connected to the peripheral function unit 303 (ADC) on the MCU chip CHM are connected with an external line.

Figure 25:
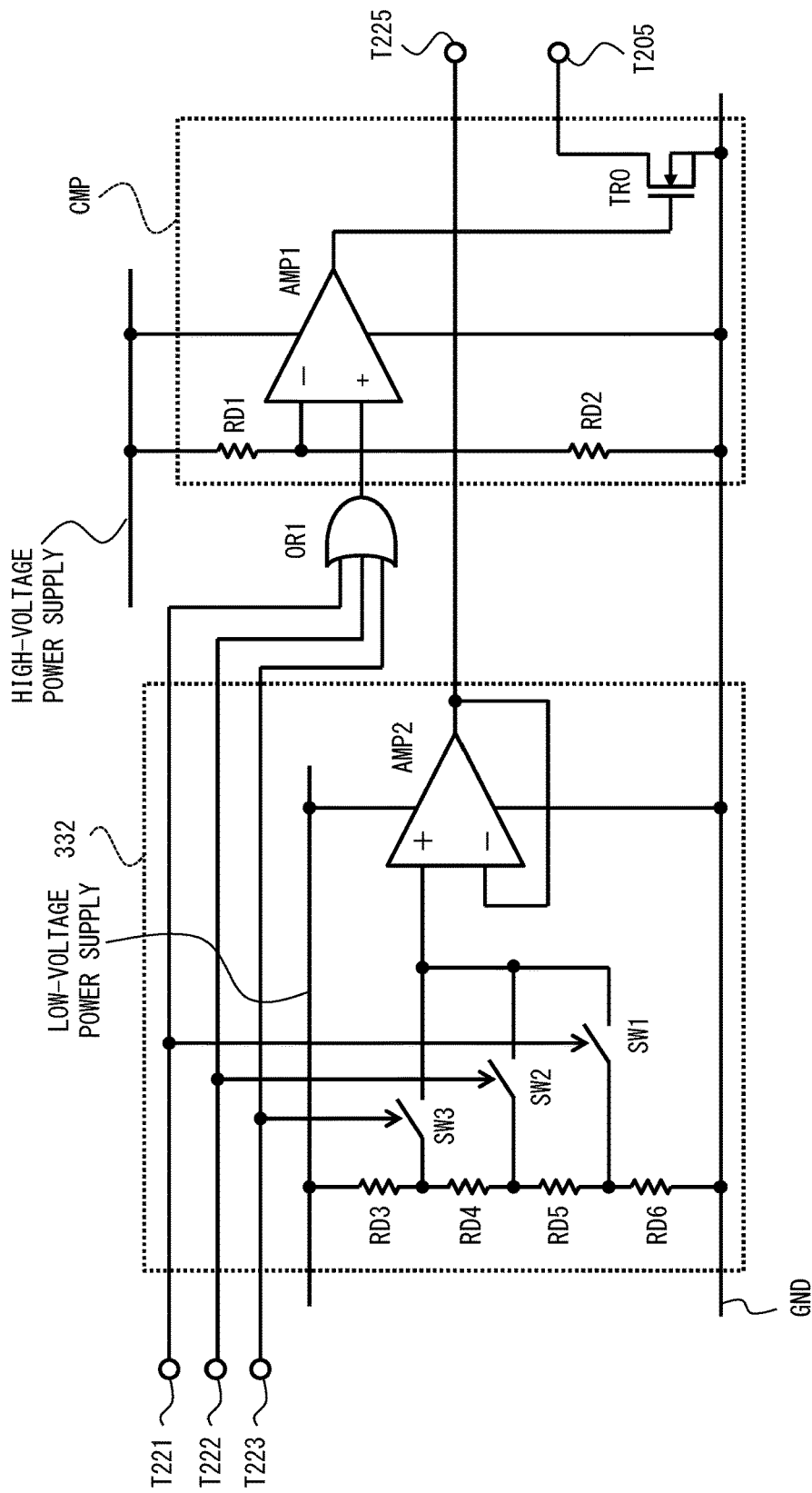
FIG. 25 is a circuit diagram showing configuration examples of a comparator and an analog voltage output circuit according to Modified Example 3 of the second embodiment.

FIG. 25 shows a specific configuration of the circuit shown in FIG. 24. The signals from the input terminals T221 to T223 shown in FIG. 25 are input to the part corresponding to the input terminal T207 of Modified Example 1 shown in FIG. 19.

The analog voltage output circuit 332 includes voltage-dividing resistors RD3 to RD6, switches SW1 to SW3, and a buffer AMP2. The voltage-dividing resistors RD3 to RD6 are connected in series between the low-voltage power supply and the GND. The switch SW3 is connected to a node between an intermediate node between the voltage-dividing resistor RD3 and the voltage-dividing resistor RD4 and the non-inverting input terminal of the buffer AMP2. The switch SW2 is connected to a node between an intermediate node between the voltage-dividing resistor RD4 and the voltage-dividing resistor RD5 and the non-inverting input terminal of the buffer AMP2. The switch SW1 is connected to a node between an intermediate node between the voltage-dividing resistor RD5 and the voltage-dividing resistor RD6 and the non-inverting input terminal of the buffer AMP2. The output terminal of the buffer AMP2 is feedback-connected to the inverting input terminal of the buffer AMP2.

The switches SW1 to SW3, which correspond to the input terminals T221 to T223, respectively, are turned on according to the signals from the input terminals T221 to T223, and the divided voltage, which is formed between the lower-voltage power supply and the GND and is formed across the voltage-dividing resistors RD3 to RD6, is supplied to the input terminal of the buffer AMP2 through the turned-on switches. This voltage is supplied to the output terminal T225 through the buffer AMP2.

The input terminals T221 to T223 are each connected to the comparator CMP, which is similar to the comparator of Modified Example 1, through the 3-input OR circuit OR1. Like in Modified Example 1, the output terminal T205 is connected to the low-voltage power supply through the pull-up resistor RU, and "L: GND potential" is output to the output terminal T205 when any one of the input terminals T221 to T223 indicates "H".

As described above, in Modified Example 3, the signal output to the output terminal T205 and the analog voltage output to the output terminal T225 according to the input signal are achieved according to a plurality of input signals. For example, the interrupt terminal (T204) of the MCU chip CHM receives the signal from the output terminal T205, and the input signal from any one of the input terminals T221 to T223 is confirmed. After that, the voltage of the output terminal T225 is confirmed by the ADC mounted on the MCU chip. With this configuration, it is possible to determine which one of the input terminals T221 to T223 has received the signal and perform processing according to the input signal. Thus, the multiplexer function can be achieved. The use of this system, for example, when the number of interrupt function terminals is insufficient, makes it possible to expand the MCU function terminal in a pseudo manner. Although three input terminals are used in this example, two or four or more input terminals may be used. In this case, switches and voltage-driving resistors corresponding to the input signals are required.

(Modified Example 4 of the Second Embodiment)

In the above example, the terminal of the MCU chip and the terminal of the IPD chip are bonded onto a lead frame (external terminal) to thereby connect the MUC chip and the IPD chip to each other. Alternatively, the MCU chip and the IPD chip may be directly connected with a bonding wire.

Figure 26:
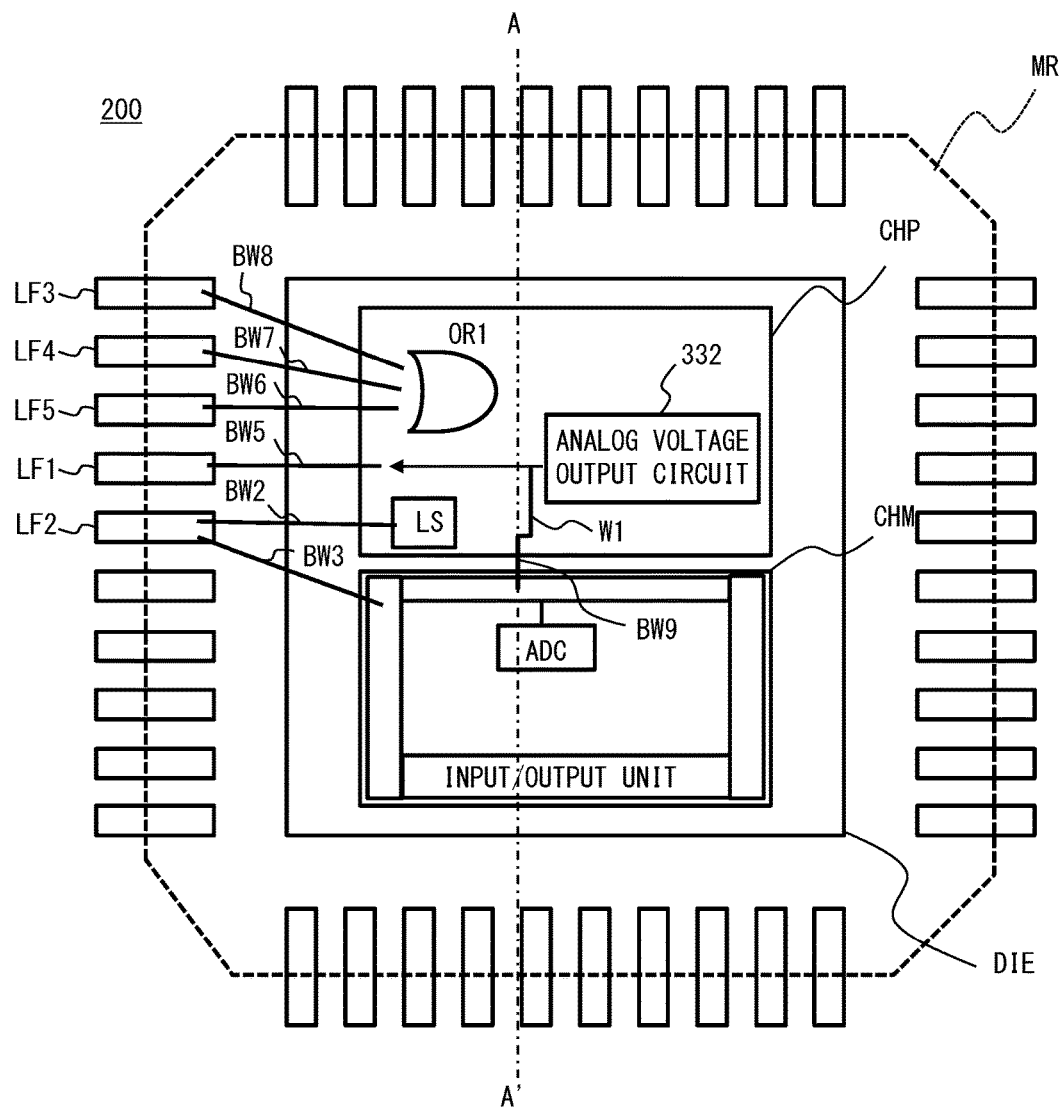
FIG. 26 is a plan view showing a schematic configuration of a semiconductor device according to Modified Example 4 of the second embodiment.
Figure 27:
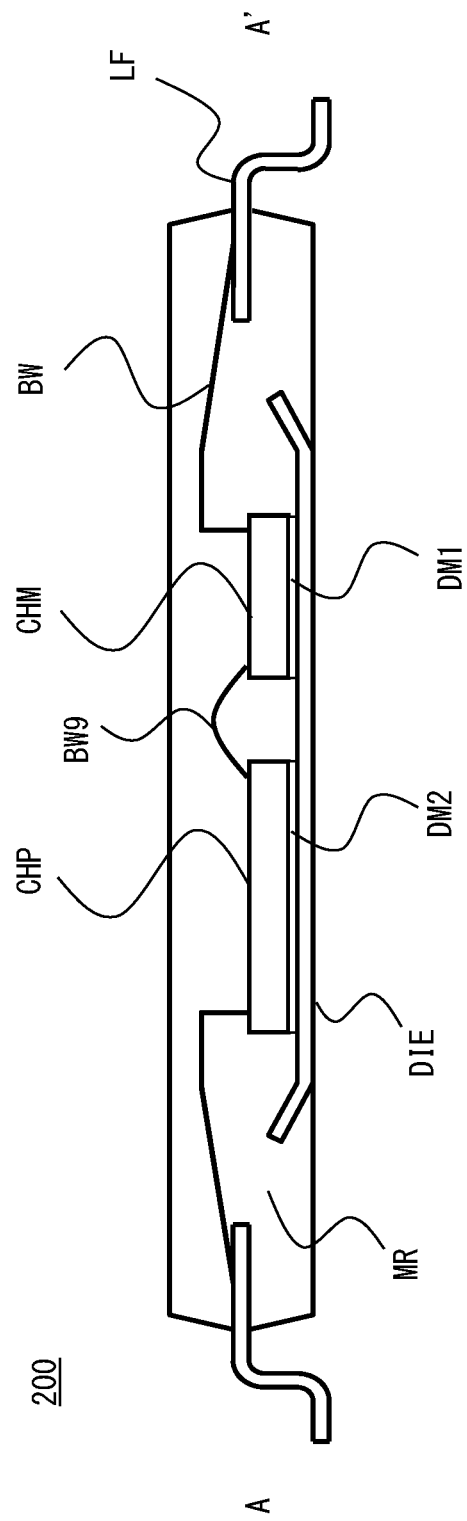
FIG. 27 is a sectional view showing a schematic configuration of the semiconductor device according to Modified Example 4 of the second embodiment.

FIGS. 26 and 27 show an example of Modified Example 4 in which the semiconductor chips are directly connected with a bonding wire in the configuration of Modified Example 3. As shown in FIGS. 26 and 27, the terminal of the analog-to-digital conversion unit ADC of the MCU chip CHM is electrically connected to the output terminal of the analog voltage output circuit 332 through a bonding wire BW9 and a wiring pattern W1 which is formed on the IPD chip CHP. The configuration shown in FIGS. 26 and 27 is based on Modified Example 3. However, also in the configurations of the second embodiment, Modified Example 1, and Modified Example 2, the semiconductor chips may be directly connected with a bonding wire.

With this configuration, the input terminal of the analog-to-digital conversion unit ADC and the output terminal of the analog voltage output circuit can be used as a dual-purpose terminal, which leads to a reduction in the number of required terminals. The dual-purpose terminal can be achieved not only by using the adjacent terminals, but also by bonding the chips together.

(Third Embodiment)

A third embodiment will be described below with reference to the drawings. The third embodiment illustrates a configuration and operation of an overheat detection circuit within the IPD chip. The other components of the third embodiment are similar to those of the first and second embodiments.

Figure 28A:
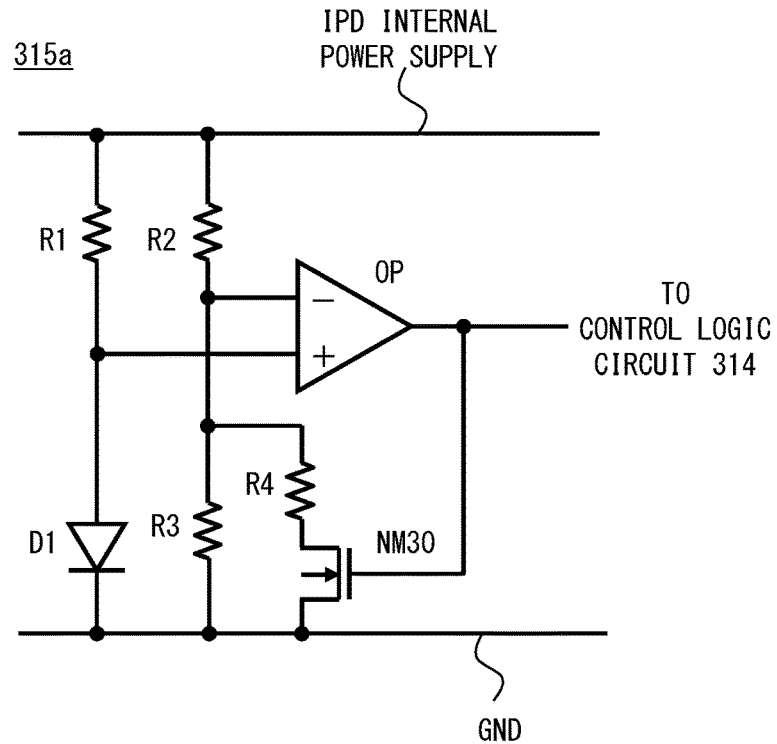
FIGS. 28A and 28B show a configuration and operation of an overheat detection circuit according to a comparative example.
Figure 28B:
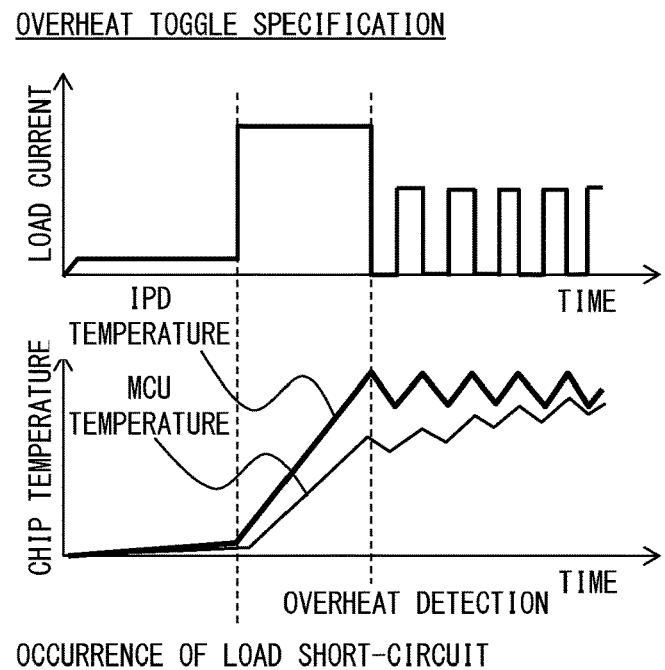

FIGS. 28A and 28B show a configuration and operation of an overheat detection circuit according to a comparative example for comparison with the third embodiment. The overheat detection circuit according to the comparative example is an example of protecting the IPD against overheating in a toggle specification (toggle system). In the toggle specification, the overheat protection is performed by repeatedly turning ON/OFF at about a temperature at which overheating is detected.

As shown in FIG. 28A, an overheat detection circuit 315a according to the comparative example includes resistors R1 to R4, a diode D1, a comparator OP, and an Nch MOS transistor NM30. The diode D1 is a temperature sensor, and the resistor R4 is a hysteresis resistor.

The resistor R1 and the diode D1 are connected in series between an IPD internal power supply and the GND, and an intermediate node between the resistor R1 and the diode D1 is connected to the non-inverting input terminal of the comparator OP. The resistor R2 and the resistor R3 are connected in series between the IPD internal power supply and the GND, and an intermediate node between the resistor R2 and the resistor R3 is connected to the inverting input terminal of the comparator OP. The resistor R4 and the Nch MOS transistor NM30 are connected in series between the GND and the intermediate node between the resistor R2 and the resistor R3. The gate of the Nch MOS transistor NM30 is connected to the output terminal of the comparator OP.

In the overheat detection circuit 315a according to the comparative example, before overheating is detected by the diode D1, the input potential of the comparator OP satisfies the relationship "non-inverting input terminal (+)">"inverting input terminal (−)". Accordingly, the comparator OP outputs "H" and the Nch MOS transistor NM30 turns on. Since the comparator OP outputs "H", the control logic circuit 314 continues the operation of the power transistor 311.

When the temperature rises and the diode D1 detects overheating, the input potential of the comparator OP satisfies "non-inverting input terminal (+)"<"inverting input terminal (−)". Accordingly, the comparator OP outputs "L" and the Nch MOS transistor NM30 turns off. When the comparator OP outputs "L", the control logic circuit 314 turns off the power transistor 311. Since the Nch MOS transistor NM30 turns off, the divided voltage of the "inverting input terminal (−)" of the comparator OP rises.

After that, when the temperature decreases and the voltage of the "non-inverting input terminal (+)" rises, the comparator OP outputs "H" and the operation of the power transistor 311 is resumed. As shown in FIG. 8B, the operation as described above is repeated and the output of the comparator OP is input to the control logic circuit 314, and thus the toggle operation is performed.

Figure 29A:
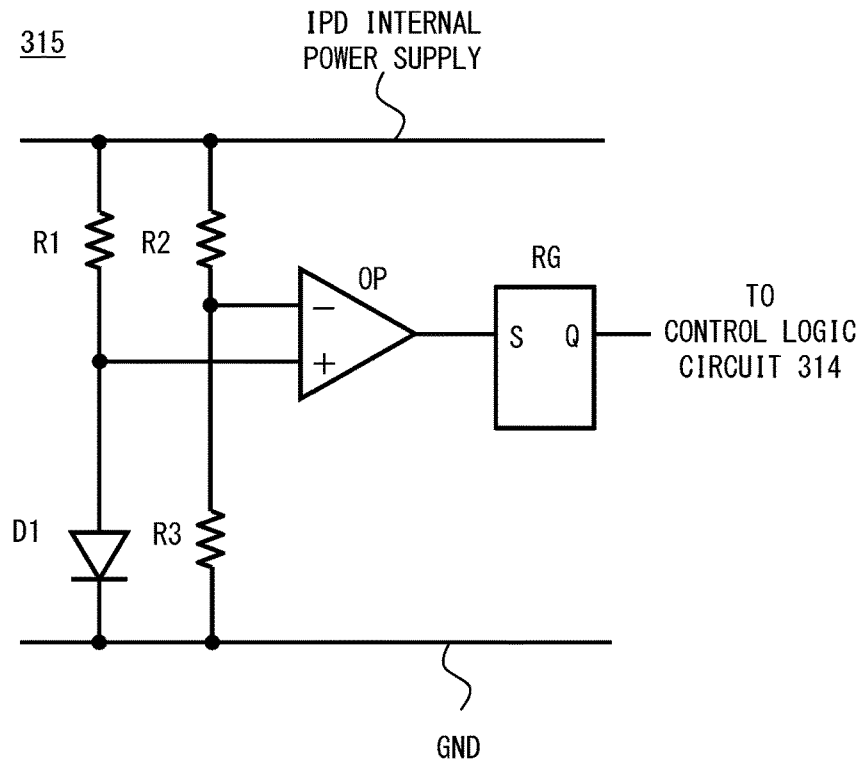
FIGS. 29A and 29B show a configuration and operation of an overheat detection circuit according to a third embodiment.
Figure 29B:
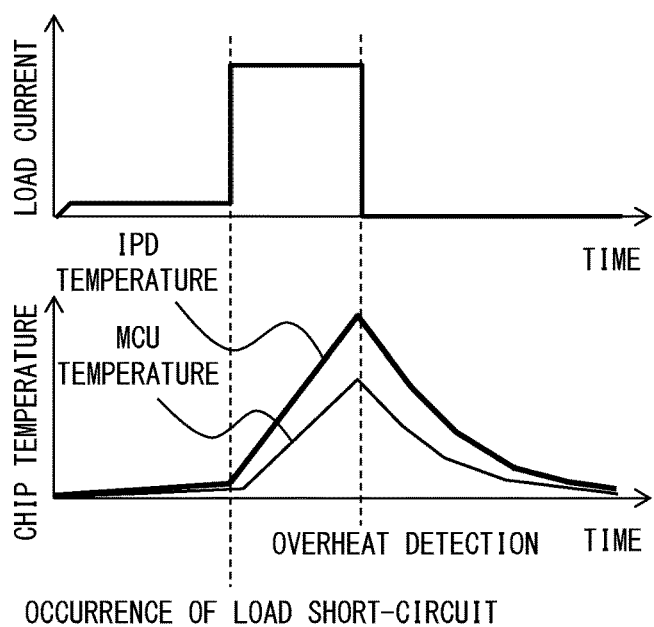

FIGS. 29A and 29B show a configuration and operation of an overheat detection circuit according to the third embodiment. In the third embodiment, the IPD is protected against overheating in a latch specification (latch system). In the latch specification, the overheat protection is performed by a latch-off operation after the overheat detection temperature is reached.

As shown in FIG. 29A, the overheat detection circuit 315 according to the third embodiment includes a register RG, in addition to the registers R1 to R3, the diode D1, and the comparator OP, which are similar to those of the comparative example. The register RG is connected to the output terminal of the comparator OP. The hysteresis resistor R4 and the Nch MOS transistor NM30 of the comparative example are not required and thus they are omitted in the third embodiment. Referring to FIG. 29A, the output of the comparator OP is output to the control logic circuit 314 through the register RG. Accordingly, as shown in FIG. 29B, the detection state is held and the output of the comparator is latched off.

In the overheat detection circuit 315 according to the third embodiment, before overheating is detected by the diode D1, the input potential of the comparator OP satisfies the relationship "non-inverting input terminal (+)">"inverting input terminal (−)", so that the comparator OP outputs "H" and the register RG latch-outputs "H", like in the comparative example. Accordingly, the control logic circuit 314 continues the operation of the power transistor 311.

When the temperature rises and the diode D1 detects overheating, the input potential of the comparator OP satisfies the relationship "non-inverting input terminal (+)"<"inverting input terminal (−)", so that the comparator outputs "L" and the register RG latch-outputs "L". Accordingly, the control logic circuit 314 turns off the power transistor 311.

The third embodiment employs the latch specification in which the latch-off operation is performed after the overheat detection temperature is reached, thereby making it possible to suppress the generation of heat in the IPD chip during short-circuiting of the load, and to prevent the heat from being transmitted to the MCU chip.

The above-mentioned program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g., magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line, such as electric wires and optical fibers, or a wireless communication line.

The invention made by the present inventor has been described in detail above based on the embodiments. However, the present invention is not limited to the above embodiments and can be modified in various ways without departing from the scope of the invention.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
a first semiconductor chip; and
a second semiconductor chip, the first semiconductor chip and the second semiconductor chip being included in one package, wherein
the first semiconductor chip includes:
   a power transistor that drives an external load;
   a drive circuit that drives the power transistor; and
   a protection circuit that prevents the power transistor from having a breakdown,
the second semiconductor chip includes:
   an arithmetic processing unit that performs arithmetic processing based on detected data output from the protection circuit; and
   a storage unit that stores a program for the arithmetic processing unit, and
the second semiconductor chip has a function of controlling operation of the power transistor according to the detected data.

2. The semiconductor device according to claim 1, wherein
the detected data includes analog data,
the second semiconductor chip includes an AD converter that converts the analog data into digital data, and
the arithmetic processing unit performs arithmetic processing on the digital data.

3. The semiconductor device according to claim 2, wherein
the protection circuit includes a temperature detection circuit that detects a temperature of the power transistor,
the detected data includes temperature data output from the temperature detection circuit,
the AD converter converts the temperature data into digital data, and
the second semiconductor chip has a function of controlling operation of the power transistor according to the temperature data.

4. The semiconductor device according to claim 1, wherein
the first semiconductor chip further includes a current detection circuit that detects a current flowing through the power transistor, and
the first semiconductor chip has a function of transmitting a signal based on the detected current to the second semiconductor chip.

5. The semiconductor device according to claim 1, wherein
the protection circuit includes an overheat detection circuit that detects an overheat state of the power transistor, and
the protection circuit has a function of interrupting the operation of the power transistor when the overheat state is detected.

6. The semiconductor device according to claim 1, wherein
the first and second semiconductor chips are mounted on a conductive island portion, and
the first and second semiconductor chips are sealed with an insulating resin.

7. The semiconductor device according to claim 6, wherein a back surface of the island portion is exposed from the resin.

8. A semiconductor device comprising:
a first semiconductor chip; and
a second semiconductor chip, the first semiconductor chip and the second semiconductor chip being included in one package, wherein
the first semiconductor chip includes:
an arithmetic processing unit that performs a logical operation; and
a storage unit that stores a program for the arithmetic processing unit, and
the second semiconductor chip includes:
a power transistor that drives an external load;
a drive circuit that drives the power transistor;
a protection circuit that protects the power transistor; and
a first level shift circuit that steps down a voltage of an externally input signal to be output to the first semiconductor chip.

9. The semiconductor device according to claim 8, wherein the second semiconductor chip further includes a second level shift circuit that boosts a signal output from the first semiconductor chip to output the signal to an outside.

10. The semiconductor device according to claim 8, wherein
the first and second semiconductor chips are mounted on a conductive island portion, and
the first and second semiconductor chips are sealed with an insulating resin.

11. The semiconductor device according to claim 10, wherein
a plurality of lead portions are arranged around the island portion, and
the first level shift circuit and a first lead portion in the plurality of lead portions are electrically connected with a first conductive wire.

12. The semiconductor device according to claim 8, wherein the first semiconductor chip and the second semiconductor chip are connected with a third conductive wire.

13. A semiconductor device comprising:
a first semiconductor chip; and
a second semiconductor chip, the first semiconductor chip and the second semiconductor chip being included in one package, wherein
the first semiconductor chip includes:
an arithmetic processing unit that performs a logical operation; and
a storage unit that stores a program for the arithmetic processing unit, and
the second semiconductor chip includes:
a power transistor that drives a first external load;
a drive circuit that drives the power transistor;
a protection circuit that protects the power transistor; and
a driver circuit that drives a second external load with power consumption smaller than that of the first external load.

14. The semiconductor device according to claim 13, wherein
the first external load is a head lamp or an indicator bulb of a vehicle, and
the second external load is an LED for an indicator, or a buzzer of a vehicle.

15. The semiconductor device according to claim 13, wherein
the first and second semiconductor chips are mounted on a conductive island portion, and
the first and second semiconductor chips are sealed with an insulating resin.

16. The semiconductor device according to claim 15, wherein
a plurality of lead portions are arranged around the island portion, and
the driver circuit and a first lead portion in the plurality of lead portions are electrically connected with a first conductive wire.

17. The semiconductor device according to claim 13, wherein the first semiconductor chip and the second semiconductor chip are connected with a third conductive wire.

18. The semiconductor device according to claim 1, wherein the first and second semiconductor chips are mounted side-by-side on a substrate.

19. The semiconductor device according to claim 1, wherein the protection circuit includes a temperature detection circuit that detects a temperature of the power transistor.

20. The semiconductor device according to claim 1, wherein the protection circuit includes an overheat detection circuit that detects an overheat state of the power transistor.

* * * * *